(12) United States Patent
Kabir et al.

(10) Patent No.: US 12,599,008 B2
(45) Date of Patent: Apr. 7, 2026

(54) TRANSISTOR WITH SOURCE MANIFOLD IN NON-ACTIVE DIE REGION

(71) Applicant: NXP USA, Inc., Austin, TX (US)

(72) Inventors: Humayun Kabir, Gilbert, AZ (US);
Ibrahim Khalil, Gilbert, AZ (US)

(73) Assignee: NXP USA, INC., Austin, TX (US)

( * ) Notice: Subject to any disclaimer, the term of this
patent is extended or adjusted under 35
U.S.C. 154(b) by 424 days.

(21) Appl. No.: 18/296,786

(22) Filed: Apr. 6, 2023

(65) Prior Publication Data

US 2024/0339409 A1 Oct. 10, 2024

(51) Int. Cl.
| | |
|---|---|
| *H10W 70/60* | (2026.01) |
| *H10W 44/20* | (2026.01) |
| *H10W 70/63* | (2026.01) |
| *H10W 70/65* | (2026.01) |

(52) U.S. Cl.
CPC .......... *H10W 70/611* (2026.01); *H10W 44/20*
(2026.01); *H10W 70/635* (2026.01); *H10W
70/65* (2026.01); *H10W 44/209* (2026.01)

(58) Field of Classification Search
CPC ... H10D 64/254; H10D 64/257; H10D 64/256
See application file for complete search history.

(56) References Cited

U.S. PATENT DOCUMENTS

| | | | | |
|---|---|---|---|---|
| 5,818,077 A | * | 10/1998 | Takahashi | ............ H10D 64/517 |
| | | | | 257/280 |
| 8,710,928 B2 | * | 4/2014 | Ng | ....................... H10D 64/254 |
| | | | | 330/307 |

| | | | | |
|---|---|---|---|---|
| 9,779,988 B2 | * | 10/2017 | Hill | ...................... H10W 20/057 |
| 11,769,807 B2 | * | 9/2023 | Jeon | ...................... H10D 64/257 |
| | | | | 257/76 |
| 12,327,778 B2 | * | 6/2025 | Kabir | .................. H10D 64/254 |
| 2003/0160279 A1 | * | 8/2003 | Baba | ..................... H10D 64/251 |
| | | | | 257/317 |
| 2004/0164407 A1 | * | 8/2004 | Nakajima | ............. H10W 44/20 |
| | | | | 257/E29.12 |

(Continued)

FOREIGN PATENT DOCUMENTS

| | | | | |
|---|---|---|---|---|
| EP | 3855486 A1 | 7/2021 | | |
| EP | 3855486 B1 | * 8/2023 | ......... | H01L 23/3677 |

(Continued)

OTHER PUBLICATIONS

U.S. Appl. No. 17/456,434; not yet published; 35 pages (Nov. 24, 2021).

(Continued)

*Primary Examiner* — Dale E Page
*Assistant Examiner* — Rohit Parthasarathy
(74) *Attorney, Agent, or Firm* — Sherry W. Gourlay

(57) ABSTRACT

A transistor includes a semiconductor die with an active
region and one or more non-active regions that do not
overlap or overlie the active region. The transistor further
includes a group of multiple transistor fingers in the active
region. One or more source vias are located adjacent to sides
of the group of transistor fingers. One or more source
manifolds are located in the non-active region(s), and the
source manifold(s) electrically connect the source via(s)
with at least one source region of the multiple transistor
fingers.

18 Claims, 10 Drawing Sheets

(56)                    References Cited

U.S. PATENT DOCUMENTS

| | | | | | |
|---|---|---|---|---|---|
| 2006/0279361 | A1* | 12/2006 | Cho | | H03F 3/14 |
| | | | | | 257/E23.102 |
| 2008/0094141 | A1* | 4/2008 | Gotou | | H03F 3/211 |
| | | | | | 330/295 |
| 2012/0267795 | A1* | 10/2012 | Shimura | | H10W 20/483 |
| | | | | | 257/776 |
| 2012/0319778 | A1* | 12/2012 | Ng | | H10D 64/254 |
| | | | | | 330/277 |
| 2015/0028427 | A1* | 1/2015 | Yamamura | | H10D 62/8503 |
| | | | | | 257/401 |
| 2015/0179566 | A1* | 6/2015 | Hill | | H10W 20/057 |
| | | | | | 257/77 |
| 2020/0014342 | A1* | 1/2020 | Jones | | H03F 1/0288 |
| 2020/0118922 | A1* | 4/2020 | Hill | | H10W 20/20 |
| 2020/0235215 | A1* | 7/2020 | Yamaguchi | | H10D 64/257 |
| 2022/0044986 | A1* | 2/2022 | Khalil | | H10D 64/257 |
| 2022/0068767 | A1* | 3/2022 | Khalil | | H10W 20/484 |
| 2022/0115297 | A1* | 4/2022 | Shilmkar | | H10W 20/40 |
| 2022/0115298 | A1* | 4/2022 | Shilimkar | | H10W 20/40 |
| 2022/0385246 | A1* | 12/2022 | Kamioka | | H03F 1/223 |
| 2023/0050485 | A1* | 2/2023 | Mizan | | H10D 64/257 |
| 2023/0163121 | A1* | 5/2023 | Hill | | H10D 84/811 |
| | | | | | 257/379 |
| 2024/0162136 | A1* | 5/2024 | Chua | | H10W 70/635 |
| 2024/0162165 | A1* | 5/2024 | Shikata | | H10W 42/121 |
| 2024/0339409 | A1* | 10/2024 | Kabir | | H10W 20/484 |

FOREIGN PATENT DOCUMENTS

| | | | |
|---|---|---|---|
| JP | 11260833 | A | 9/1999 |
| JP | H11260833 | A * | 9/1999 |
| WO | 2021193535 | A1 | 9/2021 |

OTHER PUBLICATIONS

U.S. Appl. No. 17/807,841; not yet published; 62 pages (Jun. 20, 2022).

* cited by examiner

TRANSISTOR WITH SOURCE MANIFOLD IN NON-ACTIVE DIE REGION

TECHNICAL FIELD OF THE INVENTION

The present invention relates generally to transistors implemented in semiconductor dies. More specifically, the present invention relates to a transistor with a conductive connection between transistor source regions and a source via.

BACKGROUND OF THE INVENTION

Many radio frequency (RF) power transistors include multiple, parallel-coupled field effect transistors (FETs) integrated in a semiconductor die. Input and output bond pads are electrically coupled to gate structures and drain regions of the FETs, respectively. The source regions of the FETs typically are coupled to a ground node on the die. Characteristics of the connection between the source regions and the ground node affects the source inductance and source resistance. Relatively high source inductance and resistance may result in lower gain and efficiency for the transistor. Accordingly, FET designers strive to design transistors in which source inductance and resistance is relatively low.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Embodiments of transistors described in the present disclosure may overcome some of the potential performance issues associated with conventional FETs. More specifically, various embodiments of transistors disclosed herein include connections between the source regions of multiple transistor fingers and a ground node, where the connections may be characterized by lower overall source inductance and resistance, when compared with conventional FET designs. Further, embodiments of FET cells described herein may have improved stability, gain, and efficiency, when compared with conventional FET designs.

Figure 1:
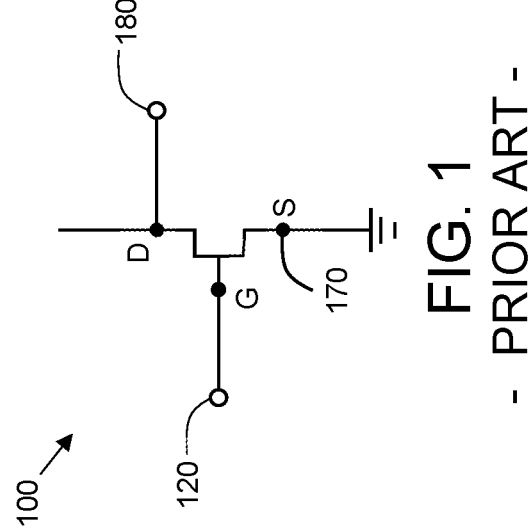
FIG. 1 shows a schematic of a common source field effect transistor (FET) circuit configuration.

FIG. 1 shows a schematic of a common source field-effect transistor (FET) device configuration 100. A FET includes a gate (G), a source(S), and a drain (D). In common source FET configuration 100, the gate, G, is coupled to an input port 120 and the drain, D, is coupled to an output port 180. The source, S, is coupled to a ground node, and thus the source serves as a common connection 170 in common source configuration 100. Thus, common source configuration 100 is an example of a two-port active device in which two of the three terminals of the FET serve as the input and output ports and the third terminal is utilized as the common connection. For clarity of discussion, transistor layouts discussed herein have common source configuration 100. However, the following discussion applies equivalently to other two-port active device configurations in which, for example, the gate may serve as the common connection or the drain may serve as the common connection.

As used herein, a FET "cell" is a transistor structure that includes multiple transistor "fingers" coupled between an input (e.g., a gate manifold structure) and an output (e.g., a drain manifold structure). A FET cell may more generically be considered a transistor. Generally, a single transistor "finger" includes a source finger, a drain finger, and a gate finger. More specifically, a single transistor "finger" includes elongated source and drain fingers (i.e., elongated source and drain regions with overlying source and drain contacts, respectively) on opposite sides of an elongated channel region, and an elongated gate finger (i.e., an elongated gate structure) overlying the elongated channel region.

According to one or more embodiments, a FET cell is integrally formed in a semiconductor die in a common source configuration (e.g., configuration 100, FIG. 1). To provide the common source connection to ground, some FET cells include conductive through substrate vias (TSVs) in the semiconductor die. In designing the common source connection to ground using TSVs, it is desirable to minimize common-node inductance, because the common-node inductance may undesirably limit the high-frequency performance of the FET cell. Designing the location of TSVs within a FET layout presents a tradeoff between performance and die size. FET performance may benefit from placing a TSV for each FET within the source region for the FET. However, TSVs are fairly large features, and placing a relatively large TSV in each source region may result in a relatively large die.

In dealing with this tradeoff, power FET layouts have generally fallen into one of two design configurations, a "slot via" layout and an "end via" layout. In the "slot via" layout, one or more TSVs are placed in each source region between active gate regions, as discussed above. In the "end via" layout, the TSVs are placed outside the active region of the FET cell on the input side or the output side of the active region. Generally, "end via" TSVs are placed on the input side of the FET cell due to practical electromigration constraints that may be present on the higher-power output side.

Figure 2:
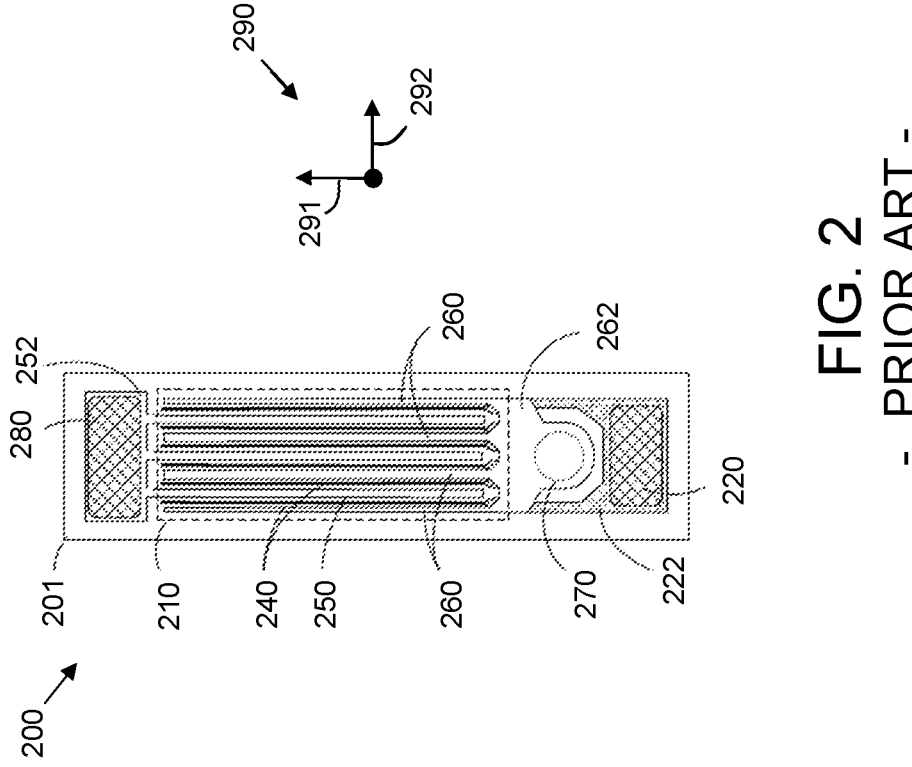
FIG. 2 shows a top view of a layout of a conventional FET cell.

For example, FIG. 2 shows a top view of a layout of a conventional FET cell 200 that has an "end via" layout. FET cell 200 is integrally formed as a portion of a semiconductor substrate 201. FET cell 200 includes an active region 210 (denoted by a dashed line box), within which are formed multiple FET fingers. More specifically, the FET fingers include multiple sets of elongated and interdigitated gate fingers 240 (six shown), drain fingers 250 (three shown), and source fingers 260 (four shown) disposed in substrate 201 in a substantially parallel configuration. All of the gate fingers 240 are coupled together by a gate manifold 222 (shaded with a stippled pattern, and partially underlying feature 262). An input bond pad 220 is coupled to the gate manifold 222 at an input side of active region 210. Similarly, drain fingers 250 are coupled together by a drain manifold 252. An output bond pad 280 is coupled to the drain manifold 252 at an output side of active region 210. Source fingers 260 are coupled via a source manifold 262 to a single TSV 270 at the input side of active region 210. TSV 270 extends through to the bottom of substrate 201 and serves to electrically couple the source fingers 260 to a ground plane (e.g., a conductive layer, not shown) on the bottom surface of substrate 201. Essentially, FET cell 200 represents a six finger transistor cell having an "end via" layout.

As indicated above, the "end via" layout of FET cell 200 may have some performance issues, when compared with a FET cell with a "slot via" layout. More specifically, due to the relatively long distance between the TSV 270 and distal ends of the source regions (i.e., ends proximate the output side of the active region 210), FET cell 200 may have relatively high source inductance and source resistance. Accordingly, FET cell 200 may have relatively lower gain and relatively higher instability when compared with FET cells with the "slot via" layout. However, as discussed above, TSVs are fairly large features, and placing a relatively large TSV in each source region according to a "slot via" layout may result in a relatively large die.

One or more embodiments of transistors described in the present disclosure may overcome some of the potential performance issues associated with conventional FET cells having "slot via" and "end via" layouts. More specifically, various embodiments of transistors disclosed herein include a semiconductor die with top and bottom surfaces, an active region that extends between the bottom and top surfaces of the semiconductor die, and input-side and/or output-side non-active regions that also extend between the bottom and top surfaces of the semiconductor die, but do not overlap or overlie the active region. A group of multiple transistor fingers is in the active region. One or more source vias are located adjacent to the side(s) of the group of multiple transistor fingers. One or more source manifolds are located in the input-side and/or output-side non-active regions. The source manifold(s) electrically connect the source via(s) with multiple source regions of the multiple transistor fingers. As will be described in detail below, the arrangement of source via(s) and the inclusion of the source manifold(s) in non-active area(s) may result in reducing overall source inductance and resistance, when compared with conventional designs. Further, embodiments of FET cells described herein may have improved stability, gain, and efficiency.

Figure 3:
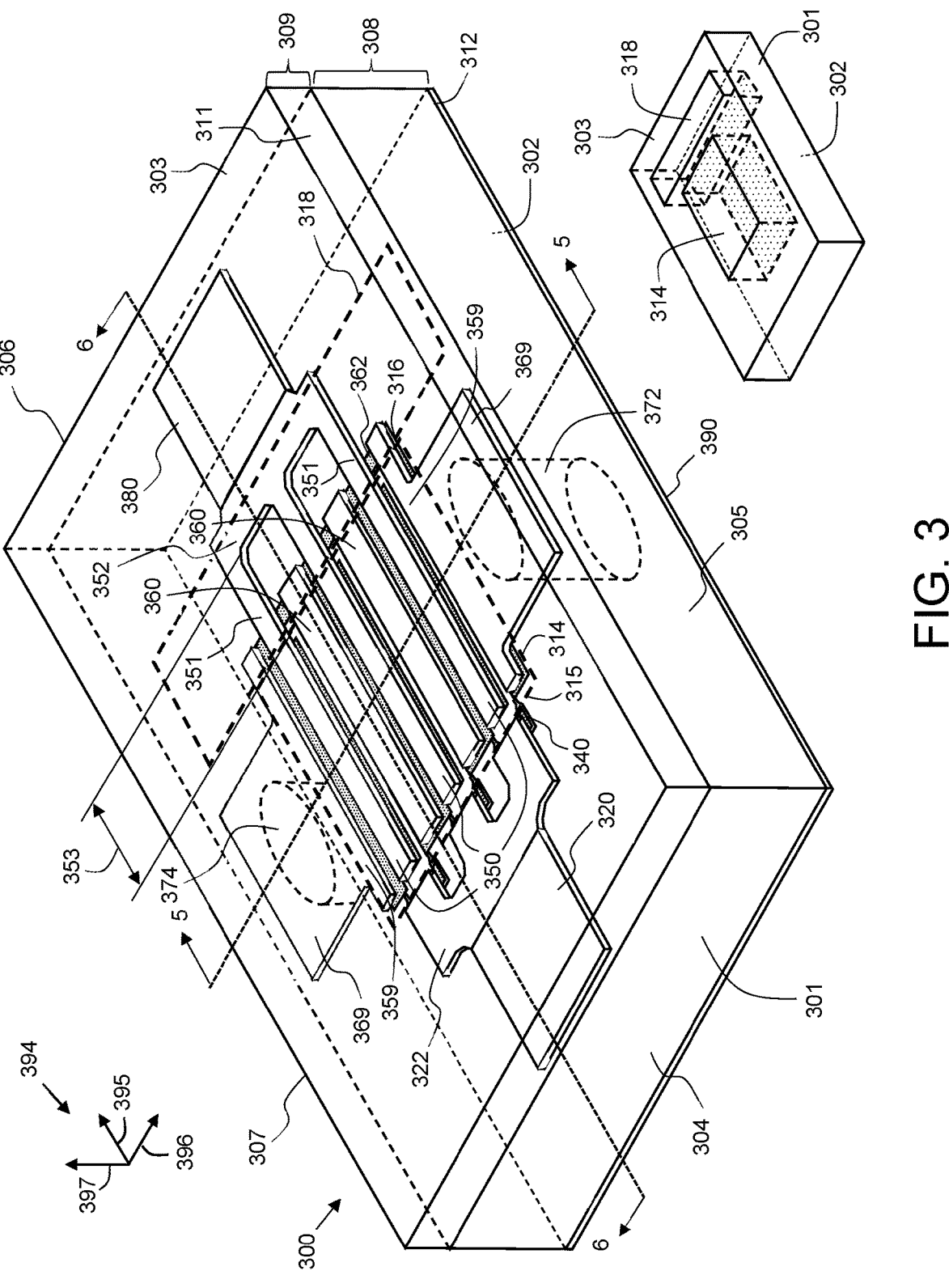
FIG. 3 shows a perspective view of an example of a FET cell, according to an embodiment of the present invention.

FIG. 3 shows a perspective view of an example of a FET cell 300 (i.e., a transistor), according to one or more embodiments. For enhanced understanding, FIG. 3 should be viewed simultaneously with FIG. 4, which shows a top view of FET cell 300, and with FIGS. 5 and 6, which show two side cross-sectional views of FET cell 300 along lines 5-5 and 6-6, respectively, of FIGS. 3 and 4. It should be noted here that certain layers may be removed in FIGS. 3-6 to facilitate understanding of the various embodiments. Cartesian coordinate system 394, with orthogonal axes 395, 396, 397, is included in FIGS. 3-6 and referenced below to better convey the relative orientations and dimensions of various features of FET cell 300. As used herein, the term "horizontal plane" means a plane that includes both axes 395 and 396 (or any plane that is parallel to the horizontal plane), and the term "vertical plane" means a plane that includes both axes 396 and 397 or a plane that includes both axes 395 and 397 (or any plane that is parallel to one of these vertical planes).

According to one or more embodiments, FET cell 300 includes a semiconductor die 301 with various input/output (I/O) and transistor features integrally formed within the semiconductor die 301. As will be described below, various features of FET cell 300 are "adjacent to" each other, while other features of FET cell 300 are "directly adjacent to" each other. As used herein "adjacent to" means that two regions or structures are next to or in close proximity to each other, whereas "directly adjacent to" means that two regions or structures are next to each other without any intervening conductive structures (e.g., conductive traces or vias) or transistor elements (e.g., drain, source, or channel regions or gate structures).

Semiconductor die 301 has a top surface 303, a bottom surface 302, and first, second, third, and fourth sides 304, 305, 306, 307, respectively. The first and third sides 304, 306 are parallel to each other, and the second and fourth sides 305, 307 are parallel to each other (and perpendicular to the first and third sides 304, 306).

The semiconductor die 301 further includes a base semiconductor substrate 308 (or "base substrate"), and a build-up structure 309 connected to an upper surface 311 of the base substrate 308. The build-up structure 309 defines the top surface 303 of the semiconductor die 301. Essentially, the base substrate 308 underlies the build-up structure 309, and the build-up structure 309 overlies an upper surface 311 of the base substrate 308. According to one or more embodiments, a conductive layer 390 is connected to a lower surface 312 of the base substrate 308, and the conductive layer 390 defines the bottom surface 302 of the semiconductor die 301. Further, the conductive layer 390 functions as a ground node for the FET cell 300.

The base substrate 308 may be formed, for example, from bulk or composite semiconductor materials, some of which are epitaxially formed (e.g., silicon (Si), gallium nitride (GaN), gallium arsenide (GaAs), silicon-on-insulator (SoI), GaN-on-insulator (e.g., GaN on Si, GaN on silicon carbide, GaN on sapphire, and so on), or other suitable materials).

Figure 5:
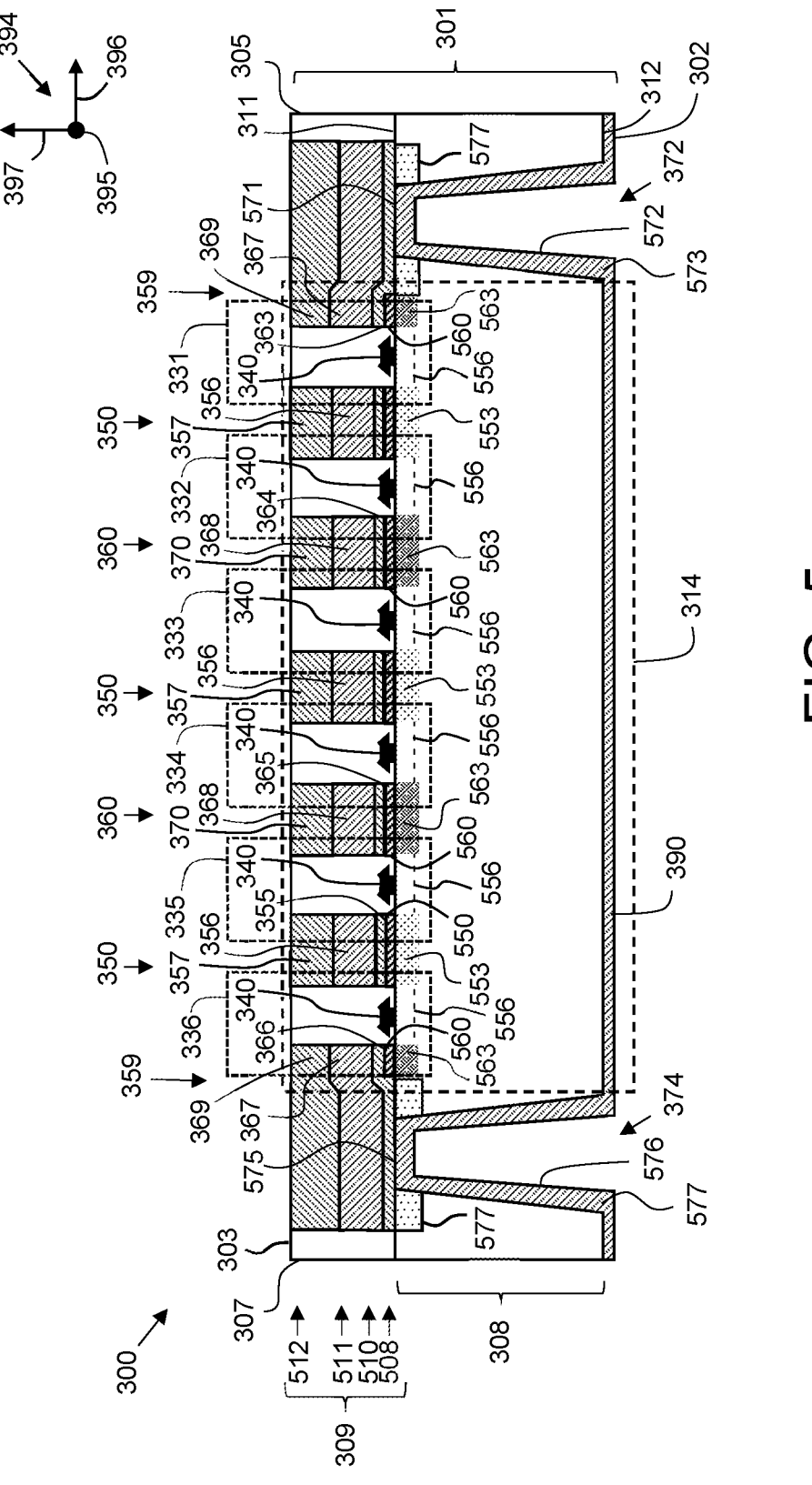
FIG. 5 shows a side, cross-sectional view of the FET cell of FIGS. 3 and 4 along line 5-5 of FIGS. 3 and 4.

According to one or more embodiments, first and second source vias 372, 374 extend through the base substrate 308. The first and second source vias 372, 374 are located next to first and second sides of an active area 314 of the die 301, and accordingly FET cell 300 may be considered to have a "side via" layout (as opposed to a "slot via" or "end via" layout). As best shown in FIG. 5, each of the source vias 372, 374 includes an opening that extends between the upper and lower surfaces 311, 312 of the base substrate 308. The source via openings may be fully or partially filled with conductive material to render the vias electrically conductive. For example, portions 572, 576 of the bottom conductive layer 390 may extend into and cover the sidewalls and the uppermost extent of the source via openings, thus providing a continuous conductive path through the source vias 372, 374 between the upper and lower surfaces 311, 312 of the base substrate 308. The conductive material within the source vias 372, 374 define upper ends 571, 575 and lower ends 573, 577 of the source vias 372, 374.

Figure 6:
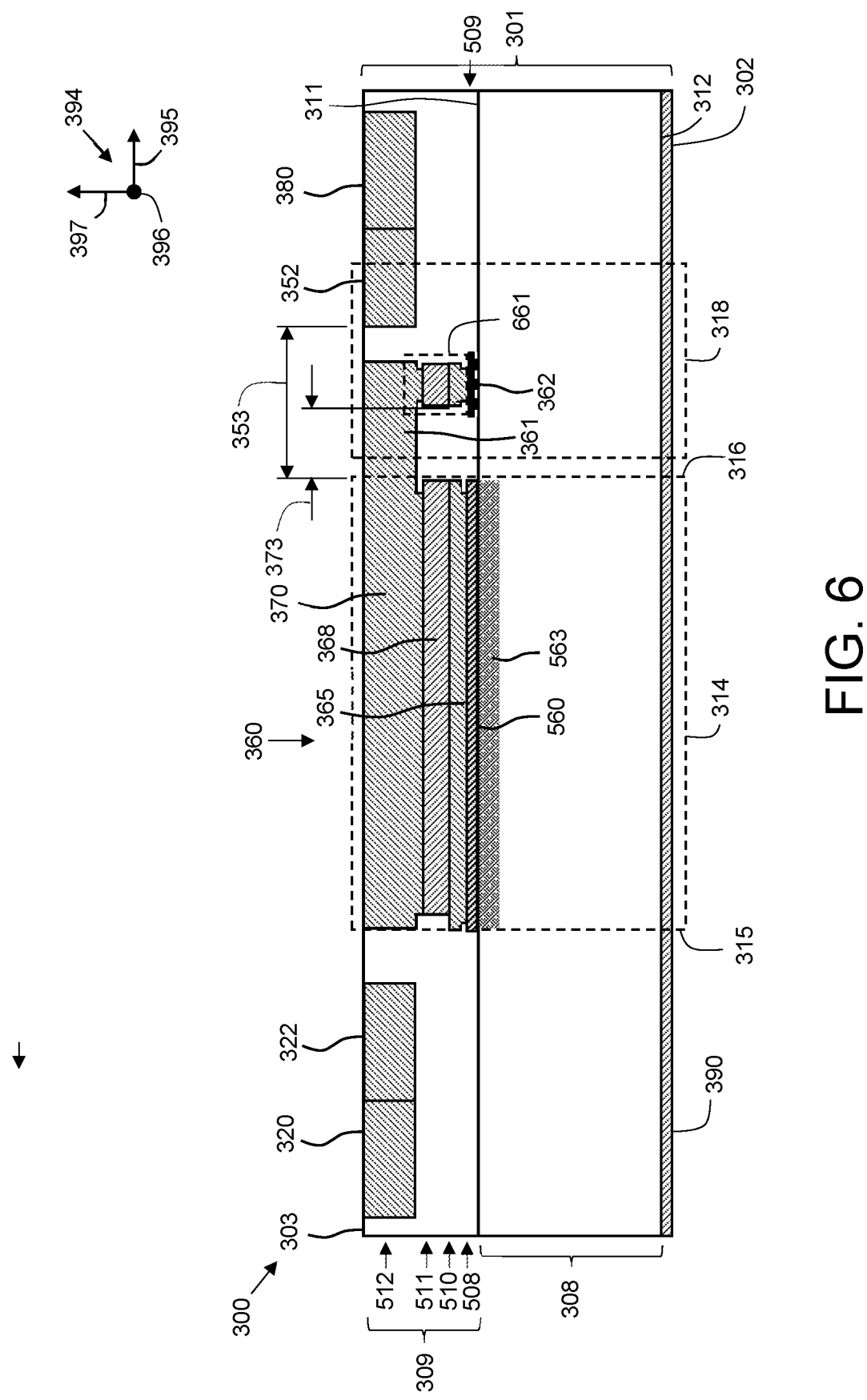
FIG. 6 shows a side, cross-sectional view of the FET cell of FIGS. 3 and 4 along line 6-6 of FIGS. 3 and 4.

As best viewed in FIGS. 5 and 6, the build-up structure 309 includes multiple dielectric layers (not numbered) that separate a contact layer 508, a gate metal layer 509 (also referred to as a "metal layer" herein), and each of multiple patterned conductive layers 510-512 (also referred to as "metal layers" herein) in an alternating arrangement. In addition, the build-up structure 309 also may include conductive vias, formed from portions of layers 510, 511, and/or 512, which extend through openings in the dielectric layers to electrically connect portions of the contact layer 508, the gate metal layer 509, and the conductive layers 510-512. In the embodiment illustrated in FIGS. 5 and 6, conductive contacts (e.g., contacts 550, 560, FIGS. 5, 6) are formed from the contact layer 508 (e.g., an ohmic metal layer), which directly contacts the upper surface 311 of the base substrate 308. Further, gate structures 340 are formed from the gate metal layer 509, which also directly contacts the upper surface 311 of the base substrate 308. As will be describe in more detail below, a source manifold 362 may be formed from a portion of the gate metal layer 509. Alternatively, the source manifold 362 may be formed from portions of another conductive layer that contacts the upper surface 311 of the base substrate 308, or alternatively from a portions of one of metal layers 510 or 511. The patterned conductive layers 510-512 include a first metal layer 510 (referred to as M0), a second metal layer 511 (referred to as M1), and a third metal layer 512 (referred to as M2), although in other embodiments, additional metal layers also may be included.

According to some embodiments, portions of the contact layer 508 are connected to the upper surface 311 of the semiconductor substrate 308. Some or all of those portions of the contact layer 508 form the below-described source and drain contacts 550, 560. The contact layer 508 may contain one or more conductive layers that include titanium (Ti), aluminum (Al), nitrogen (N), TiN, tantalum (Ta), molybdenum (Mo), gold (Au), nickel (Ni), silicon (Si), germanium (Ge), platinum (Pt), tungsten (W), and or other refractory metals. In some embodiments, the contact layer 508 may be deposited using a lift off resist process, and the contact layer 508 may be annealed to form an ohmic contact with the underlying channel (e.g., channel 556, FIG. 5).

According to some embodiments, portions of the gate metal layer 509 also are connected to the upper surface 311 of the semiconductor substrate 308. Multiple portions of the gate metal layer 509 form the gate structures 340, and another portion of the gate metal layer 509 forms the source manifold 362, in some embodiments. For example, the gate metal layer 509 may be formed from one or more conductive layers (e.g., a metal stack) selected from Ni, palladium (Pd), Pt, iridium (Ir), or Copper (Cu), combined with one or more low stress conductive materials such as gold (Au), aluminum (Al), copper (Cu), poly silicon, or other suitable material(s). In some embodiments, the gate metal layer 509 may be deposited using evaporation and a lift off resist process.

The first metal layer 510 (M0) may be a next higher layer above the contact layer 508 and the gate metal layer 509, the second metal layer 511 (M1) may be a next higher layer above the first metal layer 510, and the third metal layer 512 (M2) may be a next higher layer above the second metal layer 511. Although FIGS. 5 and 6 illustrate a build-up structure 309 with a contact layer 508, a gate metal layer 509, and three patterned conductive layers 510-512 (M0-M2), other embodiments may include more or fewer conductive layers. In addition, although various features are illustrated within particular ones of the contact layer 508, the gate metal layer 509, or the conductive layers 510-512, such features may be located in different layers than those depicted. For example, in FIG. 6, although the illustrated embodiment shows a source manifold 362 formed from a portion of layer 509, in alternate embodiments, the source manifold 362 alternatively may be formed from a portion of one of layers 508, 510, 511, or 512.

A first bond pad, referred to herein as an input bond pad 320 (or alternatively "input terminal"), is located proximate to the first side 304 of the die 301. The first bond pad 320 is exposed at the top surface 303 of the die 301. A second bond pad, referred to herein as an output bond pad 380 (or alternatively "output terminal"), is located proximate to the third side 306 of the die 301. The second bond pad 380 also is exposed at the top surface 303 of the die 301. According to various embodiments, the input and output bondpads 320, 380 may be formed from portions of an uppermost conductive layer (e.g., layer 512). As will be explained in more detail below, the first and second bond pads 320, 380 serve as input and output connection points between the FET cell 300 and external circuitry (not shown).

Figure 4:
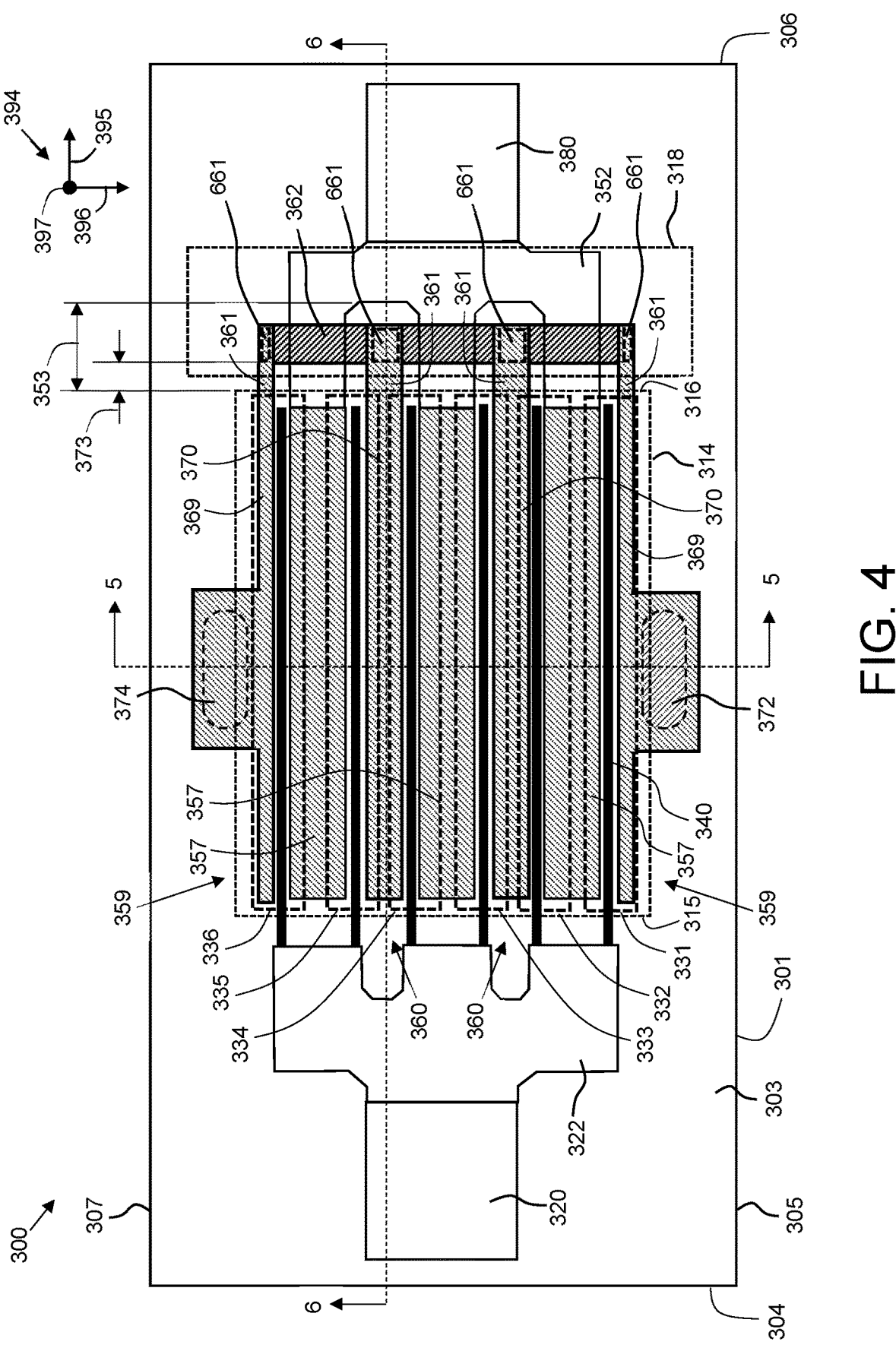
FIG. 4 shows a top view of the FET cell of FIG. 3.

According to one or more embodiments, the semiconductor die 301 includes an active region 314, which may be located roughly in the center of the die 301 (or elsewhere). As used herein, an "active region" is defined as a three-dimensional portion of a semiconductor die that includes multiple transistor fingers. The "active region" also includes portions of the semiconductor die overlying and underlying the transistor fingers, up to and including portions of the bottom and top surfaces of the semiconductor die. In FIGS. 3-5, an outer periphery of the active region is indicated by dashed-line boxes 314. The active region 314 has an input side edge 315 and an output side edge 316, with the edges 314, 315 being defined by vertical planes that extend through the semiconductor die 301. Active region 314 includes a group of multiple transistor fingers 331-336. As shown in the small representation of FET cell 300 in the bottom right corner of FIG. 3, active region 314 has a cuboid shape that extends between and includes portions of the bottom and top surfaces 302, 303 of the semiconductor die 301. In other words, the active region 314 encompasses all portions of the semiconductor die 301 between the bottom and top surfaces 302, 303 of the semiconductor die below and above the transistor fingers 331-336.

As shown in FIGS. 3-5, and according to one or more embodiments, the first source via 372 is positioned between the active area 314 and the second side 305 of the die 301, and the second source via 374 is positioned between the active area 314 and the fourth side 307 of the die 301. More particularly, referring to FIG. 4, both the first and second source vias 372, 374 are located in areas of the base substrate 308 between extensions of the input and output side edges 315, 316 of the active area 314, and between the active area 314 and the sides 305, 307 of the die 301.

According to one or more embodiments, the semiconductor die 301 also includes a first non-active region 318 that is adjacent to the active region 314. As used herein, a "non-active region" is defined as a three-dimensional portion of the semiconductor die that is devoid of active devices or active circuit elements (e.g., devoid of transistor fingers). In FIGS. 3-5, an outer periphery of the non-active region is indicated by dashed-line boxes 318. As shown in the small representation of FET cell 300 in the bottom right corner of FIG. 3, the first non-active region 318 is a cuboid shape that extends between and includes portions of the bottom and top surfaces 302, 303 of the semiconductor die 301. In other words, the non-active region 318 encompasses all portions of the semiconductor die 301 between the bottom and top surfaces 302, 303 of the semiconductor die below and above the below-described source manifold 362.

In addition, as is apparent in the small representation of FET cell 300 in the bottom right corner of FIG. 3, the non-active region 318 does not coincide with or overlap the active region 314. In other words, the active and non-active regions 314, 318 of the semiconductor die 301 are separate and distinct areas of the semiconductor die 301. No portion of the active region 314 overlies any portion of the non-active region 318, and no portion of the non-active region 318 overlies any portion of the active region 314. Further, no portion of the non-active region 318 overlies any of the transistor fingers 331-336.

In the active region 314, FET cell 300 includes six transistor fingers 331-336, although a FET cell may include fewer transistor fingers (e.g., as few as two) or more transistor fingers (e.g., as many as 10 or more). As best shown in FIG. 5, each transistor finger 331-336 includes an elongated drain finger 350 (or a portion thereof), an elongated source finger 359, 360 (or a portion thereof), and an elongated gate structure 340.

As used herein, the term "elongated" means that a region or structure has a length that is significantly greater (i.e., at least 100% greater or at least 500% greater) than a width of the region or structure. With reference to the present disclosure, the drain and source fingers 350, 359, 360 and the gate structures 340 are considered to be "elongated," in that their lengths (i.e., their dimensions parallel to axis 395 of coordinate system 394, FIGS. 3-6) are significantly greater (i.e., at least 100% greater or at least 500% greater) than their widths (i.e., their dimensions parallel to axis 396 of coordinate system 394). In the illustrated embodiments, the lengths of each of the drain and source fingers 350, 359, 360 and the gate structures 340 are about 800% to 1000% of the widths of each of the drain and source fingers 350, 359, 360 and the gate structures 340.

As best seen in FIG. 5 with reference to transistor finger 335 as an example, each drain finger 350 includes multiple features. Within the base substrate 308, each drain finger 350 includes an elongated drain region 553 (i.e., elongated into the page) at and below the upper surface 311 of the base substrate 308. In various embodiments, each drain region 553 may include a doped semiconductor region or a not-intentionally-doped (NID) semiconductor region. Either way, each drain finger 350 also includes an elongated drain contact 550, which is formed from a portion of the above-described conductive contact layer 508 in the build-up structure 309. The drain contact 550 is connected to the upper surface 311 of the base substrate 308 along the length of the drain region 553. Each drain finger 350 further includes a first conductive drain strip 355, formed from a portion of the above-described first metal layer 510 (M0), which overlies and is connected to the drain contact 550. Further, each drain finger 350 may include a second conductive drain strip 356, formed from a portion of the above-described second metal layer 511 (M1), which overlies and is connected to the first conductive drain strip 355. Further, each drain finger 350 may include a third conductive drain strip 357, formed from a portion of the above-described third metal layer 512 (M2), which overlies and is connected to the second conductive drain strip 356. For each drain finger 350, the drain region 553, drain contact 550, and the first, second, and third conductive drain strips 355, 356, 357 have essentially the same elongated planform shape, as viewed from the top of FET cell 300.

Similarly, each source finger 359, 360 includes multiple features. Within the base substrate 308, each source finger 359, 360 includes an elongated source region 563 at and below the upper surface 311 of the base substrate 308. In various embodiments, each source region 563 may include a doped semiconductor region or a not-intentionally-doped (NID) semiconductor region. Either way, each source finger 359, 360 also includes an elongated source contact 560, which is formed from a portion of the above-described conductive contact layer 508 in the build-up structure 309. The source contact 560 is connected to the upper surface 311 of the base substrate 308 along the length of the source region 563. Each source finger 359, 360 further includes a first conductive source strip 363, 364, 365, 366, formed from a portion of the above-described first metal layer 510 (M0), which overlies and is connected to the source contact 560. Further, each source finger 359, 360 may include a second conductive source strip 367, 368, formed from a portion of the above-described second metal layer 511 (M1), which overlies and is connected to the corresponding first conductive source strip 363-366. Further still, each source finger 359, 360 may include a third conductive source strip 369, 370, formed from a portion of the above-described third metal layer 512 (M2), which overlies and is connected to the corresponding second conductive source strip 367, 368. For each source finger 359, 360, each of the source region 563, source contact 560, and the first, second, and third conductive source strips 364-370 has essentially the same elongated planform shape, as viewed from the top of FET cell 300.

For each transistor finger 331-336, the source and drain regions 563, 553 are directly adjacent to and on opposite sides of an elongated, variably-conductive channel region 556. Said another way, the source, channel, and drain regions 563, 556, 553 are elongated, interdigitated, and parallel regions, similar to the first three fingers of a human hand.

Each transistor finger 331-336 also includes an elongated gate structure 340 in the build-up structure 309 and the active region 314. More specifically, each gate structure 340 overlies and extends along substantially an entire length of the channel region 556 of each transistor finger 331-336. According to one or more embodiments, the gate structures 340 may be formed from portions of a gate metal layer 509. As can be seen in FIG. 5, each gate structure 340 may have a T-shaped cross-section, which is characteristic of a lift-off deposition process that may be used to form the gate structures 340. The T-shaped cross-section includes a vertical stem that extends through the lowest dielectric layer(s) to contact the upper surface 311 of the base substrate 308, and an overhanging portion that extends over the lowest dielectric layer(s). In alternate embodiments, the gate structures 340 may have other cross-sectional shapes (e.g., rectangular) and/or may be formed using other deposition methods. During operation of the FET cell 300, electrical signals supplied to the gate structures 340 modulate the conductivity of the channel regions 556, thus modulating current flow between the source and drain regions 563, 553 of each transistor finger 331-336.

Input-side ends of the gate structures 340 (i.e., ends closest to side 304 of the die 301) are electrically coupled together by a conductive gate manifold 322 and conductive vias (not illustrated) between the input-side ends of the gate structures 340 and the gate manifold 322). The gate manifold 322 is located between the active region 314 and the first side 304 (i.e., input side) of the die 301. Further, the gate manifold 322 is electrically coupled to the input bond pad 320. The input bond pad 320 is positioned between the gate manifold 322 and the first side 304 of the die 301. As best depicted in FIG. 6, the gate manifold 322 and the input bond pad 320 may be formed from portions of an uppermost patterned conductive layer (e.g., layer 512) proximate to the top surface 303 of the die 301. In other embodiments, the gate manifold 322 may be formed from a portion of a lower conductive layer (e.g., layer 510 or 511).

According to one or more embodiments, as will be described in detail below, at least some of the source regions 563 are electrically coupled to the source vias 372, 374 through conductive source strips 365-370, source strip extensions 361, vertical conductive structures 661 (in area 318), and a source manifold 362 (e.g., a portion of the gate metal layer 509 in area 318). To more clearly convey the portions of gate metal layer 509 and vertical conductive structures 661 that are used in an embodiment to electrically couple the source regions 563 to source vias 372, 374, reference is made to FIG. 4, in which portions of overlying conductive layer 512 has been made transparent to clearly show features of underlying metal layer 509, and to FIG. 6, which includes a cross-sectional view through device 300.

According to one or more embodiments, and as best shown in FIG. 4, output-side ends (i.e., ends closest to side 306) of the source fingers 359, 360 (and more particularly output-side ends of conductive source strips 369, 370) are electrically coupled together by source strip extensions 361, vertical conductive structures 661, and a conductive source manifold 362 (also referred to as an "output-side source manifold"). For example, the source strip extensions 361 may be in-line extensions of the third conductive source strips 369, 370 (FIGS. 4, 5), and accordingly, both the third conductive source strips 369, 370 and the source strip extensions 361 may be formed from portions of the third conductive layer 512 (M2). Alternatively, the source strip extensions 361 may be formed from portions of a different conductive layer (e.g., layer 510 (M0) or layer 511 (M1)). Either way, the source strip extensions 361 extend beyond the source fingers 359, 360 in parallel with the long dimension of the source fingers 359, 360 (i.e., extensions 361 extend parallel to axis 395 of coordinate system 394). The source strip extensions 361 extend from the active region 314 into the non-active region 318 to overlie the source manifold 362. Output-side ends (i.e., ends closest to side 306) of the source strip extensions 361 are electrically coupled to (e.g., through structures 661), connected to, and/or integrally formed with the conductive source manifold 362, in various embodiments.

The conductive source manifold 362 extends in a direction that is perpendicular to the long dimensions of the source strip extensions 361 and the conductive source strips 365-370 (i.e., the source manifold 362 extends in a direction parallel to axis 396 of coordinate system 394). As best depicted in FIG. 6, and according to one or more embodiments, the source manifold 362 may be formed from a portion of a metal layer that contacts the surface 311 of the base substrate 308. In a particular embodiment, the source manifold 362 is formed from a portion of the gate metal layer 509. Accordingly, the source manifold 362 may be formed during a same processing step as forming the gate structures 340. In some embodiments, the source manifold 362 may have multiple "stem" portions (e.g., three shown in FIG. 6) that contact the upper surface 311 of the semiconductor substrate 308, and additional conductive material that physically and electrically connects the stem portions. Each of the "stem" portions may a similar cross-section to a gate channel, for example. In other embodiments, the cross-section of the source manifold 362 may be more similar to the cross-section of the gate structures 340, or otherwise may have a different cross-sectional shape (e.g., rectangular). In still other alternate embodiments, the source manifold 362 may be formed from a portion of a separately-formed conductive layer (i.e., a conductive layer that is distinct from the gate metal layer 509) at the same level as shown in FIG. 6 (i.e., a level that is connected to the upper surface 311 of the base substrate 308).

By forming the conductive source manifold 362 from a portion of the lowest conductive layer (e.g., layer 509), capacitive coupling between the source manifold 362 and the overlying drain manifold 352 (FIGS. 3, 4) may be minimized, thus avoiding performance degradation that may occur if such capacitive coupling were higher. According to other embodiments, the output-side conductive source manifold 362 may be formed from a portion of a conductive layer that is separated from the upper surface 311 of the semiconductor substrate 308 (e.g., by one or more dielectric layers), such as from a portion of the first metal layer 510 (M0) or from a portion of the second metal layer 511 (M1).

The conductive source manifold 362 has a length (i.e., the dimension parallel to axis 396 of coordinate system 394) that is sufficient to extend across and underlie the output-side ends of all of the source strip extensions 361 in the group of multiple transistor fingers 331-336. Essentially, the source strip extensions 361 extend across a gap 373 (FIGS. 4, 6) between the output side edge 316 of the active region 314 and the source manifold 362, where the gap 373 is in the non-active region 318.

The source manifold 362 is located in the non-active region 318 between the active region 314 and the third side 306 (i.e., output side) of the die 301. Essentially, the source manifold 362 is physically separated from the active region 314 in the horizontal plane by gap 373. Further, the source manifold 362 does not overlie any portion of the active area 314, and thus does not extend over any of the transistor fingers 331-336. Further still, the source manifold 362 does not underlie (or overlie) any portion of the below-described drain manifold 352. This configuration is desirable to avoid electromagnetic coupling between the drain and source manifolds 352, 362.

The source fingers include both "peripheral" source fingers 359 and "interior" source fingers 360. The peripheral source fingers 359 are located at the sides of the active area 314, and the interior source fingers 360 are located between the peripheral source fingers 359. Each of the peripheral source fingers 359 forms a portion of a single transistor finger (i.e., transistor fingers 331 and 336). Conversely, each of the interior source fingers 360 is shared by two adjacent transistor fingers. More specifically, a first one of the interior source fingers 360 is shared by adjacent transistor fingers 332 and 333, and a second one of the interior source fingers 360 is shared by adjacent transistor fingers 334 and 335.

As best seen in FIGS. 4 and 5, portions of the peripheral source fingers 359 are directly electrically coupled to the source vias 372, 374. For example, with reference to FIG. 5, the conductive material (e.g., portions of layer 510 (M0)) forming the first conductive strips 363 and 366 may extend over and contact the source vias 372, 374 (or the upper ends 571, 575 of vias 372, 374). In addition, as shown in FIG. 5, the conductive material (e.g., portions of layer 511 (M1)) forming the second conductive strips 367 also may extend over the source vias 372, 374. Further still, the conductive material (e.g., portions of layer 512 (M2)) forming the third conductive strips 369 also may extend over the source vias 372, 374.

According to one or more embodiments, the interior source fingers 360 also are electrically coupled to the source vias 372, 374. More particularly, as discussed above and shown in FIG. 4, each of the interior source fingers 360 is coupled to the source manifold 362 through a source strip extension 361, and, in some embodiments, through a vertical conductive structure (e.g., conductive structure 661, FIG. 6) between the output-side end of the source strip extension 351 and the source manifold 362. In other words, the conductive source manifold 362 may be electrically coupled to the output-side ends of all of the source strip extensions 361 through vertical conductive structures (e.g., multiple instances of conductive structure 661, FIG. 6), for example.

In one or more embodiments, the output-side ends of the source strip extensions 361 are electrically coupled to first, second, third, and fourth spatially-separated points along the source manifold 362 through vertical conductive structures (e.g., multiple instances of conductive structure 661). According to an embodiment, each conductive structure 661 includes a stackup of portions of conductive layers (e.g., portions of layers 510-512) between the source strip extension 361 and the source manifold 362. The stackup also may include one or more conductive vias formed from portions of the conductive layers that are deposited into openings in the dielectric layers between the conductive layers.

According to an embodiment, a complete conductive path between an interior source finger 360 and a source via 372 (or 374) includes a first source strip extension 361 coupled to the interior source finger 360, a first vertical conductive structure 661 coupled between the first source strip extension 361 and a first point along the source manifold 362, a portion of the source manifold 362 between the first point along the source manifold 362 and a second (spatially-separated) point along the source manifold 362, a second vertical conductive structure 661 that is coupled to the second point along the source manifold 362, a second source strip extension 361 coupled to the second vertical conductive structure 661, and a peripheral source finger 359, which is coupled to the source via 372 (or 374).

As mentioned above, in various alternate embodiments, the source manifold 362 may be formed from an intermediate patterned conductive layer (e.g., layer 510 or 511) between the upper surface 311 of the base substrate 308 and the top surface 303 of the die 301. In an embodiment in which all of the conductive source strips 363-366, the source strip extensions 361, and the source manifold 362 are formed from layer 510, for example, these structures may be formed as a continuous conductive structure by depositing layer 510, and thereafter patterning layer 510 to form the structures. In other embodiments in which all of the conductive source strips 367/368, the source strip extensions 361, and the source manifold 362 are formed from the layer 511, for example, these structures may be formed as a continuous conductive structure by depositing layer 511, and thereafter patterning layer 511 to form the structures. Alternatively, the source manifold 362 and the source strip extensions 361 may be formed from portions of different conductive layers, as they are in the embodiments illustrated in FIGS. 3-6.

Desirably, the source manifold 362 is formed from a portions of a conductive layer that is relatively close to the upper surface 311 of the base substrate 308 (e.g., layer 509 or 510) in order to minimize electromagnetic coupling between the source manifold 362 and the drain manifold 352. In whichever layers they are formed, the source strip extensions 361, the vertical conductive structures 661, and the source manifold 362 should include sufficient metal thicknesses to ensure that significant electromigration does not occur during operation of device 300, and to minimize source inductance and source resistance for the interior source fingers 360.

Electrically connecting the interior source fingers 360 to the source vias 372, 374 through the source strip extensions

361 and the source manifold 362 is advantageous in that source vias do not need to be included in the interior source fingers 360. Accordingly, the size of the FET cell 300 may be relatively small, in comparison with conventional "slot via" layouts. In addition, by placing the source vias 372, 374 next to the peripheral source fingers 359, rather than at the input or output side of the device, as is done for "end via" layouts, overall source inductance and resistance can be reduced, and the FET cell 300 may have improved stability, gain, and efficiency.

According to one or more embodiments, and as best shown in FIG. 3, output-side ends (i.e., ends closest to side 306) of the drain fingers 350 are electrically coupled together by drain strip extensions 351 and a conductive drain manifold 352. For example, the drain strip extensions 351 may be in-line extensions of the third conductive drain strips 357 (FIG. 5) and accordingly, both the third conductive drain strips 357 and the drain strip extensions 351 may be formed from portions of the third conductive layer 512 (M2). Alternatively, the drain strip extensions 351 may be formed from portions of a different conductive layer. Either way, the drain strip extensions 351 extend in parallel with the long dimension of the drain fingers 350 (i.e., extensions 351 extend parallel to axis 395 of coordinate system 394). The drain strip extensions 351 extend from the active region 314 into or through the non-active region 318. Output-side ends (i.e., ends closest to side 306) of the drain strip extensions 351 are coupled to, connected to, and/or integrally formed with the conductive drain manifold 352.

The conductive drain manifold 352 extends in a direction that is perpendicular to the drain strip extensions 351 (i.e., the drain manifold 352 extends in a direction parallel to axis 396 of coordinate system 394), and the conductive drain manifold 352 has a length (dimension parallel to axis 396 of coordinate system 394) that is sufficient to intersect all of the drain strip extensions 351 in the group of multiple transistor fingers 331-336. Essentially, the drain strip extensions 351 extend across a gap 353 (FIGS. 3, 4, 6) between the output side edge 316 of the active region 314 and the drain manifold 352, where the gap 353 is in the non-active region 318.

The drain manifold 352 is located in the non-active area 318 between the active region 314 and the third side 306 (i.e., output side) of the die 301. Essentially, the drain manifold 352 is physically separated from the active region 314 in the horizontal plane by gap 353. Further, the drain manifold 352 does not overlie any portion of the active area 314. Further still, the drain manifold 352 does not overlie (or underlie) any portion of the source manifold 362. This configuration is desirable to avoid electromagnetic coupling between the drain and source manifolds 352, 362.

In the embodiment illustrated in FIGS. 3-6, the source manifold 362 is closer to the active region 314 than the drain manifold 352 (i.e., gap 373 is smaller than gap 353). Accordingly, the drain strip extensions 351 extend over portions of the source manifold 362.

The drain manifold 352 is electrically coupled to the output bond pad 380. The output bond pad 380 is positioned between the drain manifold 352 and the third side 306 of the die 301. As best depicted in FIG. 6, the drain manifold 352 may be formed from a portion of the uppermost patterned conductive layer (e.g., layer 512) proximate to the top surface 303 of the die 301. Further, the output bond pad 380 may be formed from a portion of the uppermost patterned conductive layer (e.g., layer 512).

As discussed above, in the FET cell 301 of FIGS. 3-6, the interior source fingers 360 are electrically connected to the source vias 372, 374 through the above-described source strip extensions 361 and source manifold 362, where the source manifold 362 is located in a non-active area 318 between the active area 314 and the output bond pad 380 (i.e., the source manifold 362 is an "output-side" source manifold). Further, the source strip extensions 361 are formed from a third metal layer 512 (M2), and the source manifold 362 is formed from a lowest metal layer 509. In various alternate embodiments, an output-side source manifold may be formed from a higher metal layer (e.g., any of layers 510, 511 or 512). In still other alternate embodiments, a source manifold also or alternatively may be located in a non-active area on the input side of the die.

Figure 7:
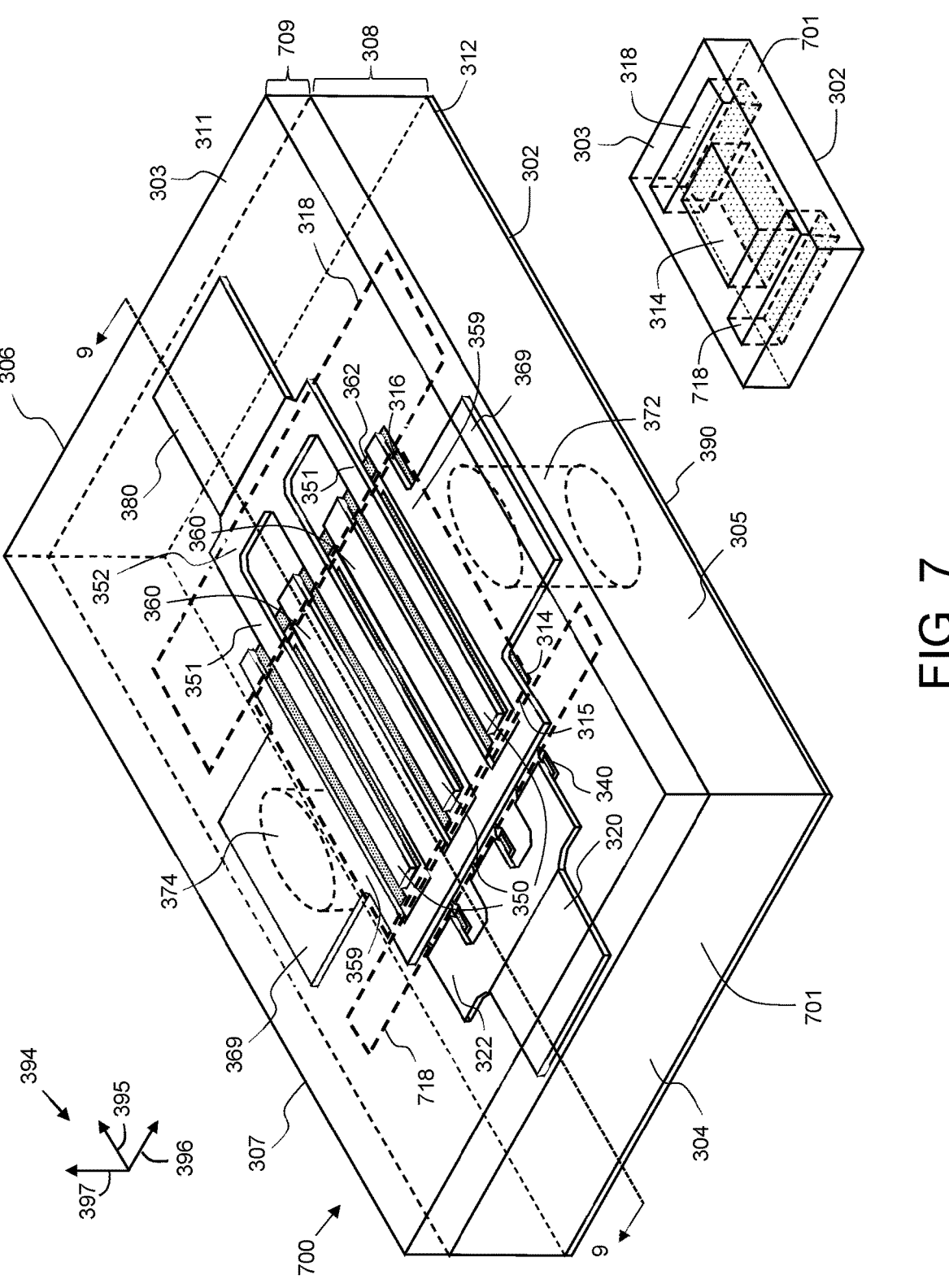
FIG. 7 shows a perspective view of an example of a FET cell, according to another embodiment of the present invention.

For example, FIG. 7 shows a perspective view of an example of a FET cell 700 that includes an input-side source manifold 762, according to another embodiment of the present invention. For enhanced understanding, FIG. 7 should be viewed simultaneously with FIG. 8, which shows a top view of FET cell 700, and with FIG. 9, which shows a side cross-sectional view of FET cell 700 along line 9-9 of FIGS. 7 and 8. In addition, reference should be made to FIG. 5, as the cross-section through FET cells 300 and 700 along line 5-5 of FIGS. 3, 4, 7, and 8 may be the same (i.e., there may be no substantial differences in the cross-sections along lines 5-5 between FET cells 300 and 700). Again, Cartesian coordinate system 394, with orthogonal axes 395, 396, 397, is included in FIGS. 7-9 and referenced below to better convey the relative orientations and dimensions of various features of FET cell 700.

The primary difference between FET cells 300 and 700 is that FET cell 700 includes both an output-side source manifold 352 in a first non-active area 318, and also an input-side source manifold 762 in a second non-active area 718. This difference will be described in detail below. However, it should be noted here that significant other portions of FET cell 700 may be substantially identical to corresponding portions of FET cell 300. Where FET cells 300 and 700 are substantially identical, the same reference numbers from FIGS. 3-6 are also used in FIG. 7. The above-described details describing elements that have identical reference numbers are incorporated from the above description of FIGS. 3-6 into the below description of FIGS. 7-9. In the interest of brevity, some but not all of those details (including details of alternate embodiments) will not be repeated in the description of FIGS. 7-9.

According to one or more embodiments, FET cell 700 includes a semiconductor die 701 with various I/O and transistor features integrally formed within the semiconductor die 701. Semiconductor die 701 has a top surface 303, a bottom surface 302, and first, second, third, and fourth sides 304, 305, 306, 307, respectively. The semiconductor die 701 further includes a base semiconductor substrate 308, and a build-up structure 709 connected to an upper surface 311 of the base substrate 308. The build-up structure 709 is different from the build-up structure 309 of FIG. 3, in that the build-up structure 709 of FIGS. 7-9 includes all of the features of build-up structure 309 (FIGS. 3-6), along with the above-mentioned second source manifold 762, as will be described below. First and second source vias 372, 374 are positioned to the sides of active area 314, and the vias 372, 374 extend through the base substrate 308 to electrically contact conductive layer 390 on the bottom surface 312 of the base substrate 308.

Figure 8:
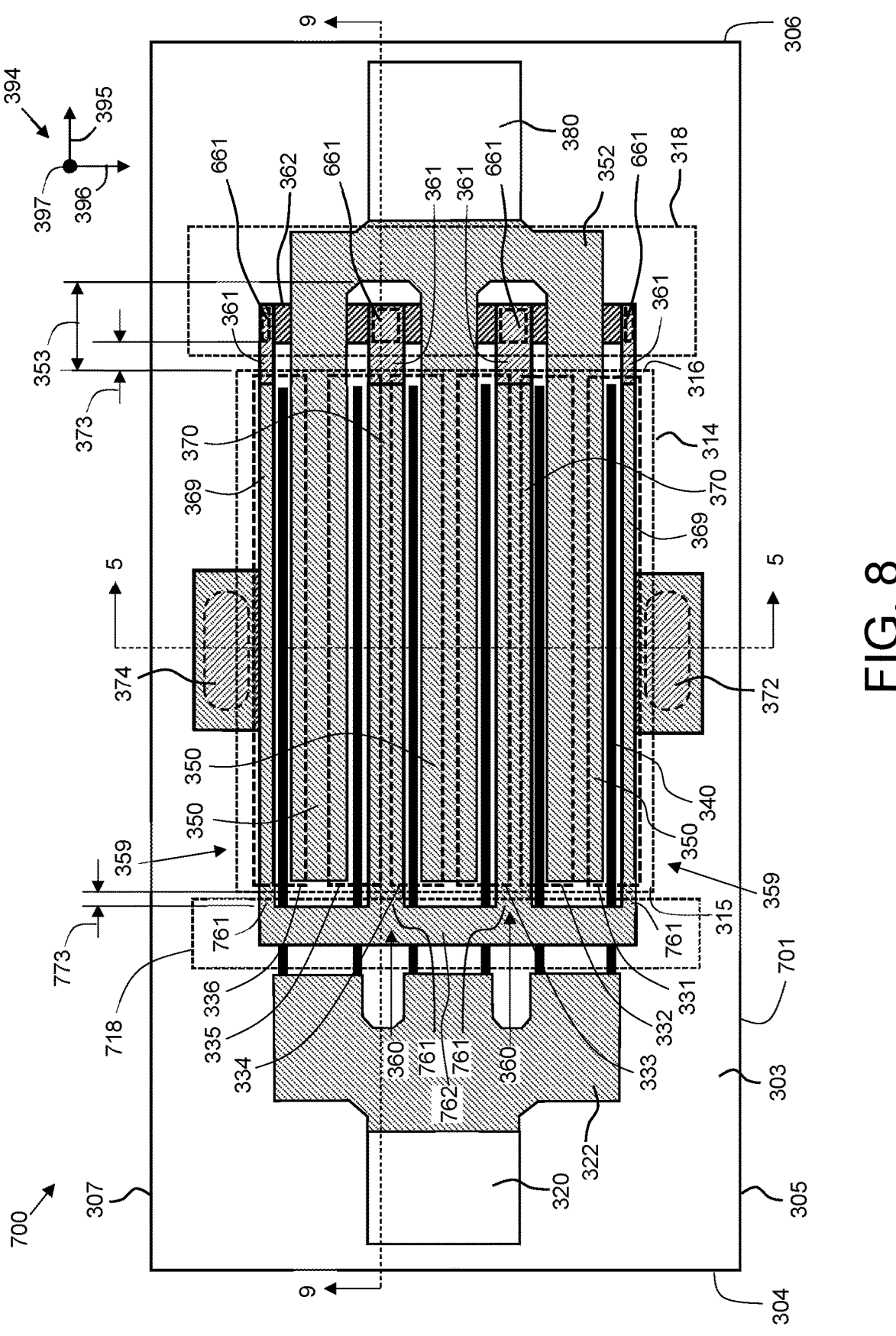
FIG. 8 shows a top view of the FET cell of FIG. 7.
Figure 9:
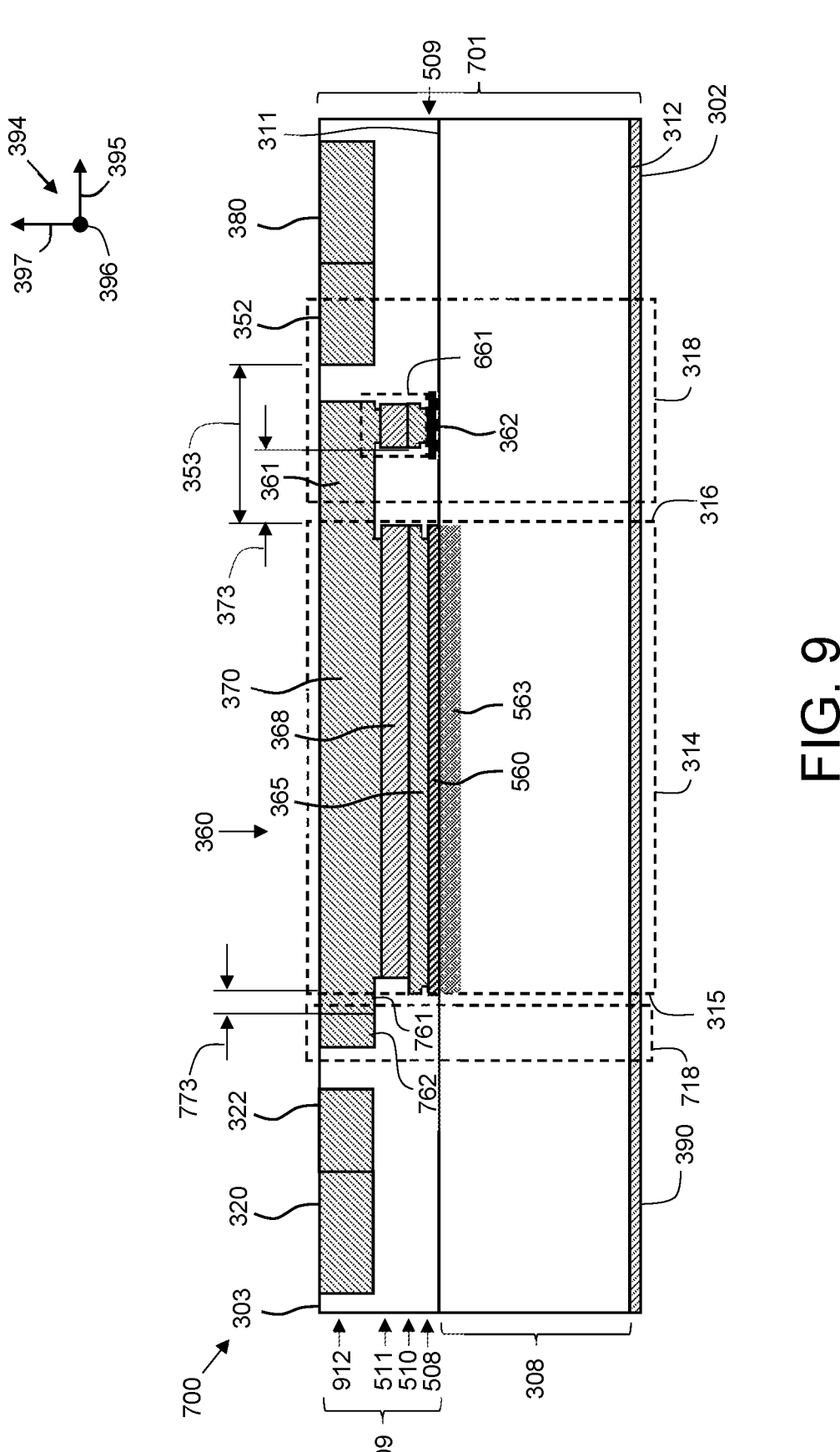
FIG. 9 shows a side, cross-sectional view of the FET cell of FIGS. 7 and 8 along line 9-9 of FIGS. 7 and 8.

As best viewed in FIG. 9, the build-up structure 709 includes multiple dielectric layers that separate a contact layer 508, a gate metal layer 509, and multiple patterned conductive layers 510, 511, 912 in an alternating arrangement. In addition, the build-up structure 709 includes conductive vias, not numbered, that electrically connect portions of the contact layer 508, the gate metal layer 509, and the conductive layers 510, 511, 912. Again, the patterned conductive layers include a first metal layer 510 (referred to as M0), a second metal layer 511 (referred to as M1), and a third metal layer 912 (referred to as M2), although in other embodiments, additional metal layers also may be included. It may be noted here that contact layer 508, gate metal layer 509, and metal layers 510 and 511 may be substantially identical, in the embodiment of FIGS. 7-9, as they are in the embodiment of FIGS. 3-6. For example, portions of the contact layer 508 may provide contacts 550, 560, and portions of the gate metal layer 509 may provide gate structures 340 and the output-side source manifold 362 (in non-active area 318). In addition, portions of metal layer 912 may correspond to the above described source via extensions 361 (extending into non-active area 318), and the source via extensions 361 and the source manifold 362 may be electrically connected through vertical conductive structures 661. Again, the details described above with respect to source via extensions 361, source manifold 362, and vertical conductive structures 661 are incorporated into this description of FIGS. 7-9. Further still, metal layer 912 may include the gate and drain manifolds 322, 352, along with the input and output bond pads 320, 380. As will be described in more detail below, the primary differences between FET cell 700 and FET cell 300 lie in differences in the third metal layer 912 of FET cell 700, as compared with the third metal layer 512 of FET cell 300.

As with FET cell 300, FET cell 700 includes an input bond pad 320, an output bond pad 380, an active region 314, and a first non-active region 318 that is adjacent to an output side edge 316 of the active region 314 (i.e., the first non-active region 318 is an "output-side non-active region"). In FIGS. 7-9, outer peripheries of the active region and output-side non-active region are indicated by dashed-line boxes 314 and 318.

According to one or more embodiments, in addition to the first non-active region 318 (with source manifold 362), the semiconductor die 701 also includes a second non-active region 718 that is adjacent to the input side edge 315 of the active region 314 (i.e., the second non-active region 718 is an "input-side non-active region"). In FIGS. 7-9, an outer periphery of the second non-active region is indicated by dashed-line boxes 718. As shown in the small representation of FET cell 700 in the bottom right corner of FIG. 7, both the output-side and input-side non-active regions 318, 718 are cuboid shapes that extend between and includes portions of the bottom and top surfaces 302, 303 of the semiconductor die 701. In other words, the input-side non-active region 718 encompasses all portions of the semiconductor die 701 between the bottom and top surfaces 302, 303 of the semiconductor die below and above the below-described input-side source manifold 762.

In addition, as is apparent in the small representation of FET cell 700 in the bottom right corner of FIG. 7, the non-active regions 318, 718 do not coincide with or overlap the active region 314. In other words, the active and non-active regions 314, 318, 718 of the semiconductor die 701 are separate and distinct areas of the semiconductor die 701. No portion of the active region 314 overlies any portion of the non-active regions 318, 718, and no portion of the non-active regions 318, 718 overlies any portion of the active region 314. Further, no portion of the non-active regions 318, 718 overlies any of the transistor fingers 331-336.

Again, FET cell 700 includes multiple transistor fingers 331-336, where each transistor finger 331-336 includes an elongated drain finger 350 (or a portion thereof), an elongated source finger 359, 360 (or a portion thereof), and an elongated gate structure 340. The structure of the drain and source fingers 350, 359, 360 and the gate structure 340 are depicted in FIG. 5 and described in detail above.

Again, as most clearly depicted in FIG. 5 (which applies also to FET cell 700, except for differences in layer 512/912), each source finger 359, 360 includes multiple features. Within the base substrate 308, each source finger 359, 360 includes an elongated source region 563 at and below the upper surface 311 of the base substrate 308. In addition, each source finger 359, 360 also includes an elongated source contact 560, which is formed from a portion of the above-described conductive contact layer. Each source finger 359, 360 further includes a first conductive source strip 363, 364, 365, 366, formed from a portion of the above-described first metal layer 510 (M0), which overlies and is connected to the source contact 560. Further, each source finger 359, 360 may include a second conductive source strip 367, 368, and a third conductive source strip 369, 370, although in FET cell 700, the third conductive source strips 369, 370 are formed from portions of the above-described third metal layer 912 (M2).

As with the FET cell 300, the source regions 563 of FET cell 700 are electrically coupled to the source vias 372, 374 through portions of one or more of the conductive layers. For example, the source regions 563 may be electrically coupled to the source vias 372, 374 through portions of conductive layers 509-512. More specifically, as previously described in detail in conjunction with FIG. 4, output-side ends (i.e., ends closest to side 306) of the source fingers 359, 360 (and more particularly output-side ends of conductive source strips 369, 370) are electrically coupled together and to the source vias 372, 374 by first source strip extensions 361 (or "output-side source strip extensions"), conductive structures 661, and a first conductive source manifold 362 (or "output-side conductive source manifold").

In addition, according to one or more embodiments, the source regions 563 of FET cell 700 also or alternatively are electrically coupled to the source vias 372, 374 through additional portions of conductive layer 912 (M2, FIG. 9). More specifically, as best shown in FIG. 8, input-side ends (i.e., ends closest to side 304) of the source fingers 359, 360 (and more particularly input-side ends of conductive source strips 369, 370) are electrically coupled together and to the source vias 372, 374 by second source strip extensions 761 (or "input-side source strip extensions") and a second conductive source manifold 762 (or "input-side conductive source manifold").

For example, the input-side source strip extensions 761 may be in-line extensions of the third conductive source strips 369, 370 (FIG. 5), and accordingly, both the third conductive source strips 369, 370 and the input-side source strip extensions 761 may be formed from portions of the third conductive layer 912 (M2, FIG. 9). Alternatively, the input-side source strip extensions 761 may be formed from portions of a different conductive layer. Either way, the input-side source strip extensions 761 extend beyond the source fingers 359, 360 in parallel with the long dimension of the source fingers 359, 360 (i.e., extensions 761 extend parallel to axis 395 of coordinate system 394). The input-side source strip extensions 761 extend from the active region 314 into the input-side non-active region 718. Input-side ends (i.e., ends closest to side 304) of the source strip extensions 761 are coupled to, connected to, and/or integrally formed with the input-side conductive source manifold 762, in one or more embodiments.

The input-side conductive source manifold 762 extends in a direction that is perpendicular to the long dimensions of the source strip extensions 761 and the conductive source strips 369, 370 (i.e., the source manifold 762 extends in a direction parallel to axis 396 of coordinate system 394). The input-side conductive source manifold 762 has a length (i.e., the dimension parallel to axis 396 of coordinate system 394) that is sufficient to intersect the input-side ends of all of the source strip extensions 761 in the group of multiple transistor fingers 331-336. Essentially, the input-side source strip extensions 761 extend across a gap 773 (FIGS. 8, 9) between the input side edge 315 of the active region 314 and the source manifold 762, where the gap 773 is in the input-side non-active region 718.

The input-side source manifold 762 is located in the input-side non-active region 718 between the active region 314 and the first side 304 (i.e., input side) of the die 701. Essentially, the input-side source manifold 762 is physically separated from the active region 314 in the horizontal plane by gap 773. Further, the input-side source manifold 762 does not overlie any portion of the active area 314. Further still, the input-side source manifold 762 does not underlie (or overlie) any portion of the gate manifold 322. This configuration is desirable to avoid electromagnetic coupling between the gate and input-side source manifolds 322, 762.

Again, the source fingers include both "peripheral" source fingers 359 and "interior" source fingers 360. As best seen in FIGS. 7 and 8, portions of the peripheral source fingers 359 are directly electrically coupled to the source vias 372, 374. For example, with reference to FIG. 5, the conductive material (e.g., portions of layer 510 (M0)) forming the first conductive strips 363 and 366 may extend over and contact the source vias 372, 374 (or the upper ends 571, 575 of vias 372, 374). In addition, the conductive material (e.g., portions of layer 511 (M1)) forming the second conductive strips 367 also may extend over the source vias 372, 374. Finally, the conductive material (e.g., portions of layer 912 (M2)) forming the third conductive strips 369 also may extend over the source vias 372, 374.

According to one or more embodiments, the interior source fingers 360 also are electrically coupled to the source vias 372, 374. For example, as discussed above, each of the interior source fingers 360 may be coupled to the source vias 372, 374 through an output-side source strip extension 361, a vertical conductive structure 661, and an output-side source manifold 362.

In addition, according to one or more embodiments and as discussed above, each of the interior source fingers 360 is electrically coupled to one or more of the source vias 372, 374 through an input-side source strip extension 761 and the input-side source manifold 762. To electrically connect the interior source fingers 360 to source via 372, a first end of the source manifold 762 is electrically coupled to source via 372 through a first one of the peripheral source fingers 359 on a first side of the active area 314. More particularly, the first end of the source manifold 762 is electrically coupled to source via 372 through a source strip extension 761 and source strips 363, 367, and 369. Similarly, a second and opposite end of the source manifold 762 is electrically coupled to source via 374 through a second one of the peripheral source fingers 359 on a second side of the active area 314. More particularly, the second end of the source manifold 762 is electrically coupled to source via 374 through a source strip extension 761 and source strips 366, 367, and 369.

In contrast with the output-side source manifold 362 (which is formed from metal layer 509), the input-side source manifold 762 may be formed from a portion of a different patterned conductive layer (e.g., layer 912). According to some embodiments, the input-side source manifold 762 is formed from a portion of the third conductive layer 912 (M2). According to one or more embodiments, all of the third conductive source strips 369, 370, the input-side source strip extensions 761, and the input-side source manifold 762 may be formed as a continuous conductive structure by depositing layer 912, and thereafter patterning layer 912 to form the structures.

Alternatively, the input-side and output-side source manifolds 762, 362 may be formed from portions of different conductive layers than described above, and/or the input-side and output-side source manifolds 762, 362 may be formed from portions of a same conductive layer (e.g., the input-side and output-side source manifolds 762, 362 both may be formed from layer 510 or 511). Either way, by including two sets of source strip extensions 361, 761 and source manifolds 362, 762, source inductance and source resistance for the interior source fingers 360 may be further reduced, as compared with embodiments that include only one source manifold.

Similar to FET cell 300, and as best shown in FIG. 7, output-side ends (i.e., ends closest to side 306) of the drain fingers 350 are electrically coupled together by drain strip extensions 351 and a conductive drain manifold 352. As described above, output-side ends (i.e., ends closest to side 306) of the drain strip extensions 351 are coupled to, connected to, and/or integrally formed with the conductive drain manifold 352. The drain manifold 352 is electrically coupled to the output bond pad 380.

Figure 10:
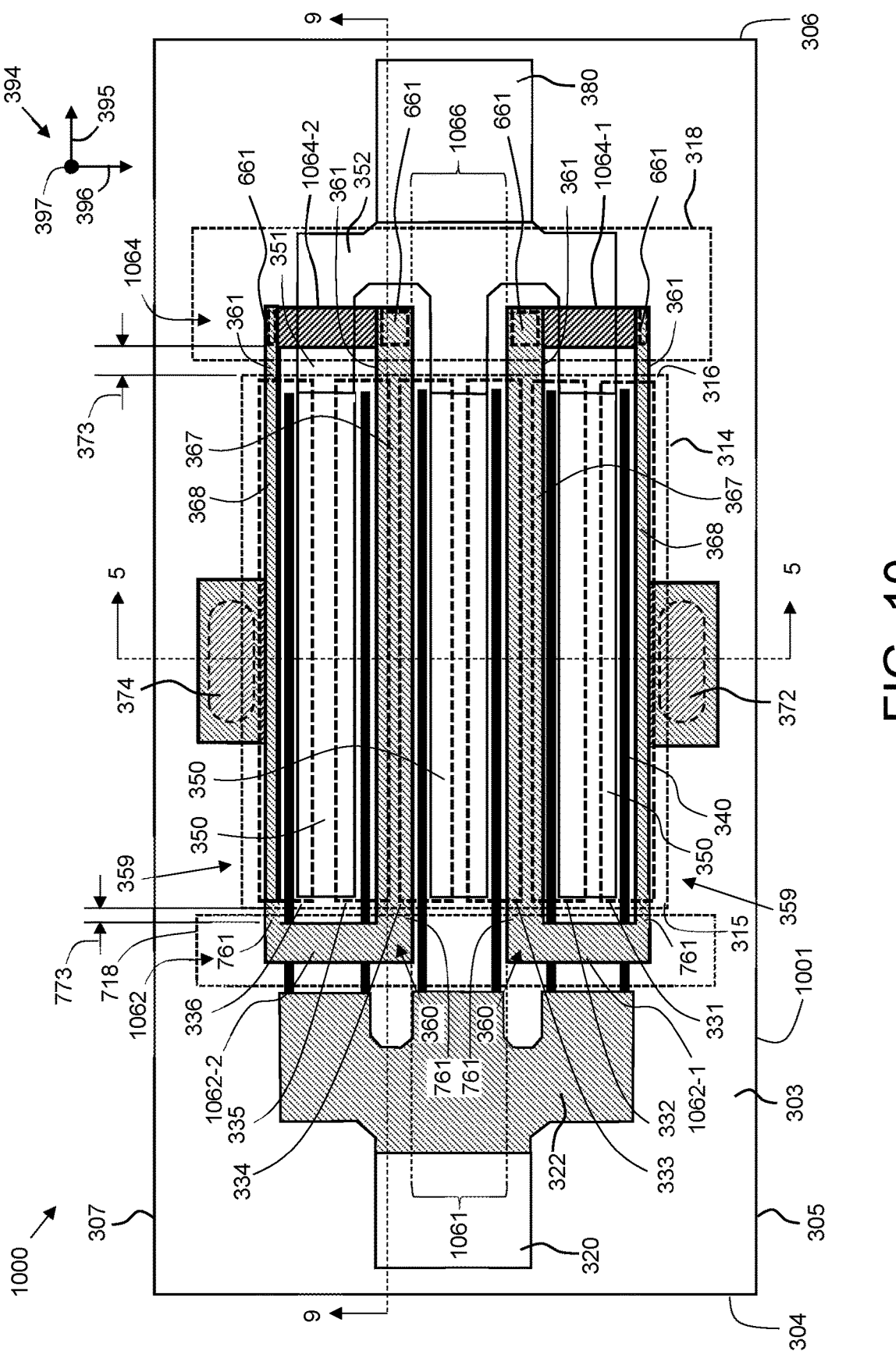
FIG. 10 shows a top view of an example of a FET cell, according to yet another embodiment of the present invention.

Various modifications may be made to the above-described embodiments of FET cells 300 and 700 while achieving the same overall result (e.g., relatively low source inductance/resistance and a relatively small device size). For example, FIG. 10 shows a top view of an example of a FET cell 1000, according to yet another embodiment of the present invention. In FIG. 10, portions of the conductive layer overlying output-side source manifold 1064 (i.e., portions of the drain strip extensions 351 and drain manifold 352) have been made transparent to clearly show features of the underlying conductive output-side source manifold 1064. In addition, it should be noted here that significant portions of FET cell 1000 may be substantially identical to corresponding portions of FET cells 300, 700. Where FET cells 300, 700, and 1000 are substantially identical, the same reference numbers from FIGS. 3-9 are also used in FIG. 10. The above-described details describing elements that have identical reference numbers are incorporated from the above description of FIGS. 3-9 into the below description of FIG. 10. In the interest of brevity, some but not all of those details (including details of alternate embodiments) will not be repeated in the description of FIG. 10.

The primary difference between FET cells 300, 700, and 1000 is that FET cell 1000 includes input-side and output-side source manifolds 1062, 1064 that have gaps 1061, 1066 between two adjacent transistor fingers (e.g., between fingers 333 and 334). Accordingly, whereas all transistor fingers 331-336 in FET cells 300, 700 are coupled through source manifolds 362 and/or 762 to both source vias 372, 374 on both sides of the group of transistor fingers 331-336, in FET cell 1000, some of the transistor fingers (e.g., fingers 331-333) in a group of multiple transistor fingers are coupled only to the first source via (e.g., source via 372), and others of the transistor fingers (e.g., fingers 334-336) are coupled only to the second source via (e.g., source via 374). This difference will be described in more detail below.

According to one or more embodiments, FET cell 1000 includes a semiconductor die 1001 with various I/O and transistor features integrally formed within the semiconductor die 1001. Semiconductor die 1001 has a top surface 303, a bottom surface (not numbered), and first, second, third, and fourth sides 304, 305, 306, 307, respectively. The semiconductor die 1001 further includes a base semiconductor substrate (not numbered), and a build-up structure (not numbered) connected to an upper surface of the base substrate. The build-up structure is different from the build-up structure 309, 709 of FIGS. 3 and 7, in that the build-up structure of FET cell 1000 includes gaps 1061, 1066 in the input-side and output side source manifolds 1062, 1064, as will be described below. First and second source vias 372, 374 are positioned to the sides of active area 314, and the vias 372, 374 extend through the base substrate to electrically contact a conductive layer (e.g., conductive layer 390) on the bottom surface of the base substrate.

The build-up structure includes multiple dielectric layers that separate a contact layer (e.g., layer 508), a gate metal layer (e.g., layer 509), and multiple patterned conductive and dielectric layers in an alternating arrangement. In addition, the build-up structure includes vertical conductive structures (e.g., structures 661), that electrically connect portions of the gate metal layer and the conductive layers. Again, the patterned conductive layers include a first metal layer (M0), a second metal layer (M1), and a third metal layer (M2), although in other embodiments, additional metal layers also may be included. It may be noted here that the contact, gate metal, and conductive layers and the vertical conductive structures may be substantially identical, in the embodiment of FIGS. 10, as they are in the embodiments of FIGS. 3-9, except for differences in the source manifolds 1062, 1064, as described below.

As with FET cells 300 and 700, FET cell 1000 includes an input bond pad 320, an output bond pad 380, an active region 314, a first non-active region 318 that is adjacent to an output side edge 316 of the active region 314, and a second non-active region 718 that is adjacent to an input side edge 315 of the active region 314. In FIG. 10, outer peripheries of the active region and the first and second non-active regions are indicated by dashed-line boxes 314, 318, and 718.

Again, FET cell 1000 includes multiple transistor fingers 331-336, where each transistor finger 331-336 includes an elongated drain finger 350 (or a portion thereof), an elongated source finger 359, 360 (or a portion thereof), and an elongated gate structure 340. The structure of the drain and source fingers 350, 359, 360 and the gate structure 340 are depicted in FIG. 5 and described in detail above.

Again, as most clearly depicted in FIG. 5 (which applies also to FET cell 1000), each source finger 359, 360 includes an elongated source region 563, an elongated source contact 560, first conductive source strips 363, 364, 365, 366, formed from portions of the first metal layer (M0), second conductive source strips 367, 368, formed from portions of the second metal layer (M1), and third conductive source strips 369, 370, formed from portions of the third metal layer (M2).

As with the FET cells 300, 700, the source regions 563 of FET cell 1000 are electrically coupled to the source vias 372, 374 through portions of one or more of the conductive layers. For example, each of the source regions 563 may be electrically coupled to one (but not both) of the source vias 372, 374 through input-side and/or output-side source manifolds 1062 and/or 1064. The input-side source manifold 1062 is located in non-active region 718, and the output-side source manifold 1064 is located in non-active region 318. The FET cell 1000 of FIG. 10 is similar to the FET cell embodiments shown in FIGS. 3-9, except in the embodiment of FIG. 10, each of the input-side and output-side source manifolds 1062, 1064 are divided into two source manifold segments. More particularly, input-side source manifold 1062 is divided into source manifold segments 1062-1 and 1062-2, which are separated by non-conductive gap 1061. Similarly, output-side source manifold 1064 is divided into source manifold segments 1064-1 and 1064-2, which are physically separated by non-conductive gap 1066.

Input-side ends (i.e., ends closest to side 304) of the source fingers 359, 360 for a first group of transistor fingers 331-333 are electrically coupled together and to the first source via 372 by source strip extensions 761 and segment 1062-1 of source manifold 1062. Input-side ends (i.e., ends closest to side 304) of the source fingers 359, 360 for a second group of transistor fingers 334-336 are electrically coupled together and to the second source via 374 by source strip extensions 761 and segment 1062-2 of source manifold 1062. Similarly, output-side ends (i.e., ends closest to side 306) of the source fingers 359, 360 for a first group of transistor fingers 331-333 are electrically coupled together and to the first source via 372 by source strip extensions 361 and segment 1064-1 of source manifold 1064. Output-side ends (i.e., ends closest to side 306) of the source fingers 359, 360 for a second group of transistor fingers 334-336 are electrically coupled together and to the second source via 374 by source strip extensions 361 and segment 1064-2 of source manifold 1064. Accordingly, the source fingers of the first group of transistor fingers 331-333 are electrically coupled only to the first source via 372 (i.e., through source manifold segments 1062-1, 1064-1), and the source fingers of the second group of transistor fingers 334-336 are electrically coupled only to the second source via 374 (i.e., through source manifold segments 1062-2, 1064-2). Essentially, each of the source manifold segments 1062-1, 1062-2, 1064-1, 1064-2 electrically couples the source regions of multiple transistor fingers to a single source via 372 or 374. More particularly, each of the source manifold segments 1062-1, 1062-2, 1064-1, 1064-2 electrically couples at least one of the interior source finger 360 to a single source via 372 or 374.

The input-side source manifold segments 1062-1-1062-2 are located in the input-side non-active region 718 between the active region 314 and the first side 304 (i.e., input side) of the die 1001. Essentially, input-side source manifold segments 1062-1-1062-2 are physically separated from the active region 314 in the horizontal plane by gap 773. Further, the input-side source manifold segments 1062-1-1062-2 do not overlie any portion of the active area 314. Further still, the input-side source manifold segments 1062-1-1062-2 do not underlie (or overlie) any portion of the gate manifold 322.

Similarly, the output-side source manifold segments 1064-1-1064-2 are located in the output-side non-active region 318 between the active region 314 and the third side 306 (i.e., output side) of the die 1001. Essentially, output-side source manifold segments 1064-1-1064-2 are physically separated from the active region 314 in the horizontal plane by gap 773. Further, the output-side source manifold segments 1064-1-1064-2 do not overlie any portion of the active area 314. Further still, the output-side source manifold segments 1064-1-1064-2 do not underlie (or overlie)

any portion of the drain manifold 352, although they do underlie the drain strip extensions 351.

The output-side source manifold 1064 may be formed from a portion of a lowest conductive layer (e.g., gate metal layer 509, as discussed above, or alternatively either of M0, M1) between the upper surface of the base substrate and the top surface 303 of the die 1001. According to some embodiments, the output-side source manifold 1064 is formed from a portion of the gate metal layer 509. The input-side source manifold 1062 may be formed from a portion of an uppermost conductive layer (e.g., M2, as discussed above, or alternatively either of M0 or M1).

Alternatively, the input-side and output-side source manifolds 1062, 1064 may be formed from portions of different conductive layers than described above, and/or the input-side and output-side source manifolds 1062, 1064 may be formed from portions of a same conductive layer (e.g., the input-side and output-side source manifolds 1062, 1064 both may be formed from layer M0, or both may be formed from layer M1).

In still other alternate embodiments, FET cell 1000 may include only one of the segmented source manifolds 1062 or 1064. In embodiments in which only segmented source manifold 1062 is present on the input side of the die 1001, a non-segmented source manifold (e.g., source manifold 362, FIG. 3) may be present on the output side of the die 1001. Similarly, in embodiments in which only segmented source manifold 1064 is present on the output side of the die 1001, a non-segmented source manifold (e.g., source manifold 762, FIG. 7) may be present on the input side of the die 1001. In still other embodiments, a FET cell may include source manifold segments 1062-1 and 1064-2, but not source manifold segments 1062-2 and 1064-1.

Similar to FET cells 300 and 700, output-side ends (i.e., ends closest to side 306) of the drain fingers 350 are electrically coupled together by drain strip extensions 351 and a conductive drain manifold 352. As described above, output-side ends (i.e., ends closest to side 306) of the drain strip extensions 351 are coupled to, connected to, and/or integrally formed with the conductive drain manifold 352. The drain manifold 352 is electrically coupled to the output bond pad 380.

Figure 11:
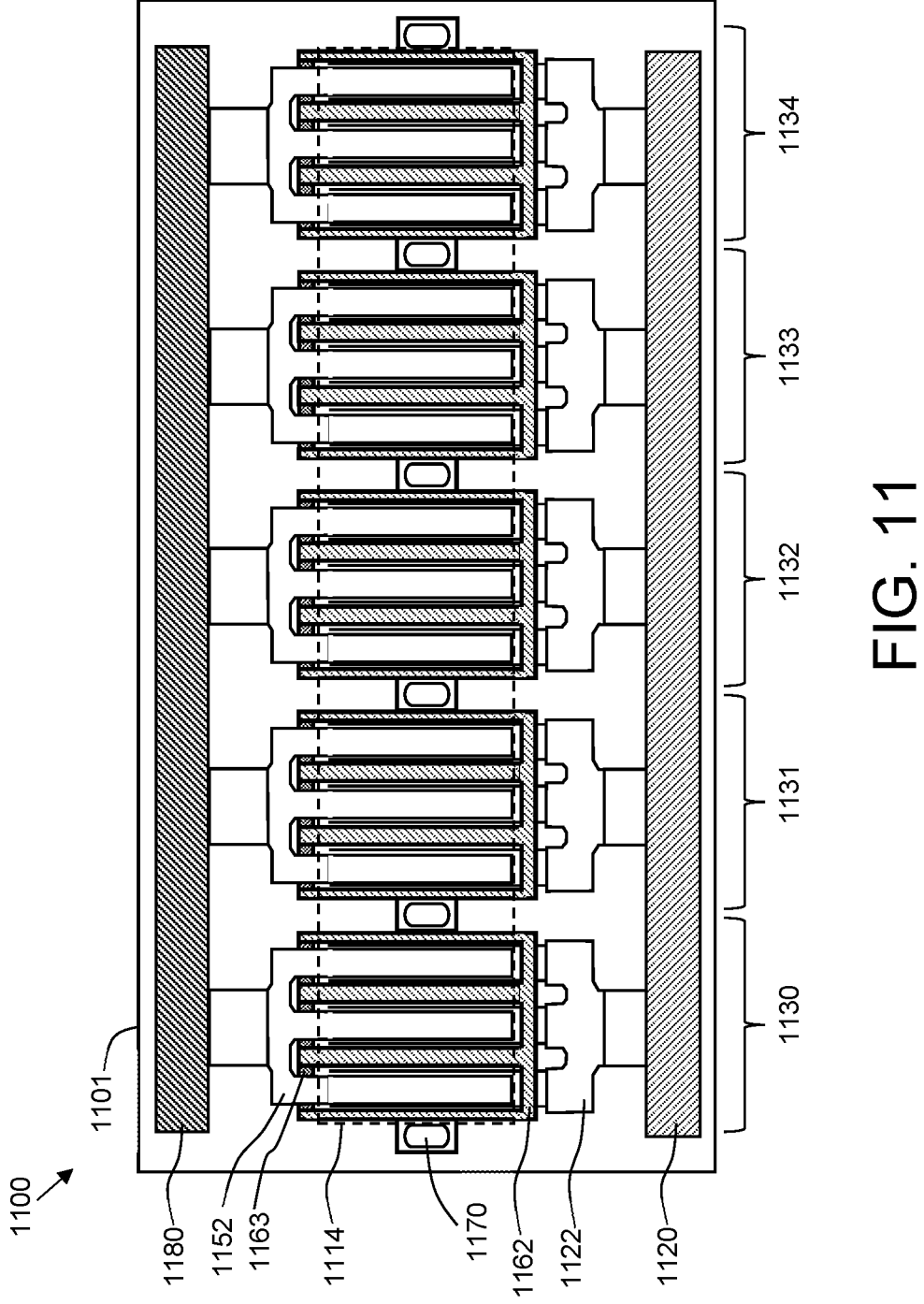
FIG. 11 shows a top view of a semiconductor die that includes multiple instances of the FET cell of FIG. 3.

In order to build a power transistor of a desired power capability, multiple instances of FET cells 300, 700, or 1000 may be replicated in parallel and interconnected with common input and output bond pads. For example, FIG. 11 shows a top view of a FET 1100 that includes a number, N, of instances of the FET cell 700 of FIG. 7. More particularly, FET 1100 includes five FET cells 1130, 1131, 1132, 1133, 1134 (i.e., N=5) integrally formed within a single semiconductor die 1101. Those of skill in the art would understand, based on the description herein, that the number, N, of FET cells included within a device may be greater or less than five (e.g., $1 \leq N \leq 20$ or more, in various embodiments), depending on the desired periphery and power capability of the FET 1100.

As previously discussed, semiconductor die 1101 may include a base semiconductor substrate (e.g., base semiconductor substrate 308, FIGS. 3, 5-7, and 9) and a build-up structure (e.g., build-up structure 309, 709, FIGS. 3, 5-7, and 9) coupled to the top surface of the base semiconductor substrate. The base semiconductor substrate may be formed, for example, from bulk or composite semiconductor materials (e.g., Si, GaN, GaAs, Sol, GaN-on-insulator, or other suitable materials). The build-up structure includes multiple dielectric layers that separate multiple patterned conductive layers, along with conductive vias that electrically connect portions of the conductive layers. The various details and embodiments associated with substrates 301, 701, and 1001, discussed above, apply also to the die 1101 of FIG. 11, and accordingly those details and embodiments are intended to apply also to FET 1100.

A source via 1170 (e.g., source vias 372, 374, FIGS. 3-10) is present on both sides of each of the FET cells 1130-1134, as described previously. Accordingly, some source vias 1170 are located between adjacent FET cells (i.e., between groups of transistor fingers). Further, each of the FET cells 1130-1134 includes an active region (e.g., active region 314, FIGS. 3-10) formed in the die 1101. A combination of the active regions for all FET cells 1130-1134 is referred to as a cumulative active region 1114, which is bounded by an outer periphery that is represented by a dashed line box in FIG. 11. Cumulative active region 1114 includes the active regions of all of the sets of transistor fingers (e.g., transistor fingers 331-336, FIGS. 3-10) in all of the FET cells 1130-1134.

Input-side ends of the gate structures for each of the FET cells 1130-1134 are coupled together by a gate manifold 1122. An input bond pad 1120, is coupled to all of the gate manifolds 1122 at an input side of active region 1114. As shown in FIG. 11, the input bond pad 1120 is an elongated conductive structure that extends across the combined width of all of the FET cells 1130-1134. When FET 1100 is incorporated into a larger electrical system (e.g., an amplifier), a plurality of wirebonds would have first ends coupled along the length of the input bond pad 1120, and second ends coupled to a bond pad on a substrate that supports other portions of the electrical system.

Similarly, output-side ends of the drain fingers for each of the FET cells 1130-1134 are coupled together by a drain manifold 1152. An output bond pad 1180 is coupled to the drain manifolds 1152 of all of the FET cells 1130-1134 at an output side of active region 1114. As shown in FIG. 11, the output bond pad 1180 is an elongated conductive structure that extends across the combined width of all of the FET cells 1130-1134. When FET 1100 is incorporated into a larger electrical system (e.g., an amplifier), a plurality of wirebonds would have first ends coupled along the length of the output bond pad 1180, and second ends coupled to a bond pad on a substrate that supports other portions of the electrical system.

Additionally, and according to one or more embodiments, input-side and/or output-side ends of the source fingers for each of the FET cells 1130-1134 are coupled to one another through input-side and/or output-side source manifolds 1162, 1163, which are located outside of the active area 1114 (i.e., the manifolds 1162, 1163 are located in non-active areas of the die 1101). Each source manifold 1162, 1163, in turn, is coupled to one or more source TSVs 1170 disposed on one or both sides of each FET cell 1130-1134. The source TSVs 1170 may be electrically coupled to a conductive layer (e.g., layer 390, FIGS. 3, 5, 6, 7, 9) on the bottom surface of the die 1101. The source manifolds 1162, 1163 may be configured similarly or identical to source manifolds 362, 762, 1062, 1064 (FIGS. 3-10), or according to any previously-described alternate embodiment of source manifolds 362, 762, 1062, 1064.

An embodiment of a transistor includes a semiconductor die with top and bottom surfaces, and first and third parallel sides, and second and fourth parallel sides. The semiconductor die further includes a base substrate, a build-up structure overlying an upper surface of the base substrate, an active region that extends between the bottom and top surfaces of the semiconductor die, and a first non-active region that extends between the bottom and top surfaces of the semiconductor die and that does not overlap or overlie the active region. The transistor further includes an input terminal between the active region and the first side of the semiconductor die, and an output terminal between the active region and the third side of the semiconductor die. A first group of multiple transistor fingers is in the active region, and a first source via is located next to the first group of multiple transistor fingers and between the second side of the semiconductor die and the first group of multiple transistor fingers. A first source manifold is located in the first non-active region, and the first source manifold electrically connects the first source via with at least one source region of the multiple transistor fingers of the first group of multiple transistor fingers.

According to a further embodiment, the first group of multiple transistor fingers includes a first transistor finger with a first elongated source region in the base substrate, and a first elongated source contact connected to the first elongated source region and formed from a first portion of a conductive contact layer. The transistor further includes a first source strip overlying and electrically coupled to the first elongated source contact in the active region, a first source strip extension that extends from the first source strip into the first non-active region over the first source manifold, and a first vertical conductive structure coupled between the first source strip extension and the first source manifold. The first vertical conductive structure is formed from a stackup of conductive layers between the first source strip extension and the first source manifold.

Another embodiment of a transistor includes a semiconductor die with top and bottom surfaces, an active region that extends between the bottom and top surfaces of the semiconductor die, and a non-active region that extends between the bottom and top surfaces of the semiconductor die and that does not overlap or overlie the active region. A group of multiple transistor fingers is in the active region. A first source via is located adjacent to a first side of the group of multiple transistor fingers, and a second source via is located adjacent to a second side of the group of multiple transistor fingers. A source manifold is located in the non-active region, and the source manifold electrically connects the first and second source vias with multiple source regions of the multiple transistor fingers of the group of multiple transistor fingers.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transistor comprising:

a semiconductor die with top and bottom surfaces, and first, second, third, and fourth sides, wherein the first and third sides are parallel to each other, and wherein the second and fourth sides are parallel to each other, and wherein the semiconductor die further includes a base substrate, a build-up structure overlying an upper surface of the base substrate, an active region that extends between the bottom and top surfaces of the semiconductor die, and a first non-active region that extends between the bottom and top surfaces of the semiconductor die and that does not overlap or overlie the active region;

an input terminal between the active region and the first side of the semiconductor die;

an output terminal between the active region and the third side of the semiconductor die;

a first group of multiple transistor fingers in the active region, wherein the first group of multiple transistor fingers includes a first transistor finger with a first elongated source region in the base substrate, and a first elongated source contact connected to the first elongated source region and formed from a first portion of a conductive contact layer;

a first source via located next to the first group of multiple transistor fingers and between the second side of the semiconductor die and the first group of multiple transistor fingers;

a first source manifold located in the first non-active region, wherein the first source manifold electrically connects the first source via with at least one source region of the multiple transistor fingers of the first group of multiple transistor fingers;

a first source strip overlying and electrically coupled to the first elongated source contact in the active region;

a first source strip extension that extends from the first source strip into the first non-active region over the first source manifold; and a first vertical conductive structure coupled between the first source strip extension and the first source manifold, wherein the first vertical conductive structure is formed from a stackup of conductive layers between the first source strip extension and the first source manifold.

2. The transistor of claim 1, wherein:

the first non-active region of the semiconductor die is devoid of active circuit elements, and the first source manifold does not extend over the first group of multiple transistor fingers or over any other transistor fingers.

3. The transistor of claim 1, wherein:

the active region encompasses all portions of the semiconductor die between the bottom and top surfaces of the semiconductor die below and above the first group of multiple transistor fingers;

the first non-active region encompasses all portions of the semiconductor die between the bottom and top surfaces of the semiconductor die below and above the first source manifold; and the active region and the first source manifold are separated by a gap.

4. The transistor of claim 1, wherein:

the first non-active region is located between the active region and the input terminal;

the first source manifold is located in a portion of the build-up structure in the first non-active region; and the active region and the first source manifold are separated by a gap.

5. The transistor of claim 1, wherein:

the first non-active region is located between the active region and the output terminal; and the first source manifold is located in a portion of the build-up structure in the first non-active region.

6. The transistor of claim 1, wherein:

the build-up structure includes a metal layer that directly contacts the base substrate, and a first patterned conductive layer between the metal layer and the top surface of the semiconductor die; and the first source manifold is formed from a first portion of the first patterned conductive layer.

7. The transistor of claim 1, wherein:

the build-up structure includes a metal layer that directly contacts the base substrate; and the first source manifold is formed from a first portion of the metal layer.

8. The transistor of claim 7, further comprising:

a second non-active region in the semiconductor die;

a first patterned conductive layer in the build-up structure between the metal layer and the top surface of the semiconductor die; and a second source manifold located in the second non-active region and formed from a first portion of the first patterned conductive layer, wherein the second source manifold also electrically connects the first source via with the at least one source region of the multiple transistor fingers of the first group of multiple transistor fingers.

9. The transistor of claim 1, further comprising:

a second source via located next to the first group of multiple transistor fingers and between the fourth side of the semiconductor die and the first group of multiple transistor fingers, wherein the first conductive source manifold electrically connects the second source via with the at least one source region of the multiple transistor fingers of the first group of multiple transistor fingers.

10. The transistor of claim 1, further comprising:

a second group of multiple transistor fingers in the active region, wherein the first source via is located between the first and second groups of multiple transistor fingers.

11. The transistor of claim 1, wherein:

the transistor further comprises a conductive layer on the bottom surface of the semiconductor die that functions as a ground node for the transistor; and the first source via comprises a through substrate via that extends between top and bottom surfaces of the base substrate, wherein the first source via is connected to the conductive layer.

12. The transistor of claim 1, wherein:

the first group of multiple transistor fingers includes:

a first transistor finger with a first elongated source region in the base substrate, a first elongated drain region in the base substrate, a first elongated channel region in the base substrate between the first elongated source region and the first elongated drain region, a first elongated gate structure over the first elongated channel region, and a first elongated source contact connected to the first elongated source region and formed from a first portion of a conductive contact layer, and a second transistor finger with a second elongated source region in the base substrate, a second elongated drain region in the base substrate, a second elongated channel in the base substrate between the second elongated source region and the second elongated drain region, a second elongated gate structure over the second elongated channel, and a second elongated source contact connected to the second elongated source region and formed from a second portion of the conductive contact layer.

13. A transistor comprising:

a semiconductor die with top and bottom surfaces, and first, second, third, and fourth sides, wherein the first and third sides are parallel to each other, and wherein the second and fourth sides are parallel to each other, and wherein the semiconductor die further includes a base substrate, a build-up structure overlying an upper surface of the base substrate, an active region that extends between the bottom and top surfaces of the semiconductor die, and a first non-active region that extends between the bottom and top surfaces of the semiconductor die and that does not overlap or overlie the active region;

an input terminal between the active region and the first side of the semiconductor die;

an output terminal between the active region and the third side of the semiconductor die;

a first group of multiple transistor fingers in the active region, wherein the first group of multiple transistor fingers includes:

a first transistor finger with a first elongated source region in the base substrate, a first elongated drain region in the base substrate, a first elongated channel region in the base substrate between the first elongated source region and the first elongated drain region, a first elongated gate structure over the first elongated channel region, and a first elongated source contact connected to the first elongated source region and formed from a first portion of a conductive contact layer, and a second transistor finger with a second elongated source region in the base substrate, a second elongated drain region in the base substrate, a second elongated channel in the base substrate between the second elongated source region and the second elongated drain region, a second elongated gate structure over the second elongated channel, and a second elongated source contact connected to the second elongated source region and formed from a second portion of the conductive contact layer;

a first source via located next to the first group of multiple transistor fingers and between the second side of the semiconductor die and the first group of multiple transistor fingers; and a first source manifold located in the first non-active region, wherein the first source manifold electrically connects the first source via with at least one source region of the multiple transistor fingers of the first group of multiple transistor fingers;

a first source strip overlying and electrically coupled to the first elongated source contact in the active region;

a first source strip extension that extends from the first source strip into the first non-active region over the first source manifold;

a first vertical conductive structure coupled between the first source strip extension and a first point along the first source manifold;

a second source strip overlying and electrically coupled to the second elongated source contact in the active region;

a second source strip extension that extends from the second source strip into the first non-active region over the first source manifold; and a second vertical conductive structure coupled between the second source strip extension and a second point along the first source manifold that is spatially-separated from the first point.

14. A transistor comprising:

a semiconductor die with top and bottom surfaces, an active region that extends between the bottom and top surfaces of the semiconductor die, and a first non-active region that extends between the bottom and top surfaces of the semiconductor die and that does not overlap or overlie the active region;

a first group of multiple transistor fingers in the active region;

a first source via located adjacent to a first side of the first group of multiple transistor fingers;

a second source via located adjacent to a second side of the first group of multiple transistor fingers; and a first source manifold located in the first non-active region, wherein the first source manifold electrically connects the first and second source vias with multiple source regions of the multiple transistor fingers of the first group of multiple transistor fingers, and wherein the first source manifold is divided into first and second segments that are separated by a non-conductive gap, wherein the first segment is electrically coupled to the first source via, the second segment is electrically coupled to the second source via, a first group of the multiple transistor fingers is coupled to the first segment, and a second group of the multiple transistor fingers is coupled to the second segment.

15. The transistor of claim 14, wherein:

the first non-active region is located between the active region and an output side of the semiconductor die.

16. The transistor of claim 14, wherein:

the first non-active region is located between the active region and an input side of the semiconductor die.

17. The transistor of claim 14, wherein:

the first non-active region is located between the active region and an output side of the semiconductor die;

the semiconductor die further includes a second non-active region located between the active region and an input side of the semiconductor die; and the transistor further includes a second source manifold located in the second non-active region, wherein the second source manifold also electrically connects the first and second source vias with the multiple source regions of the multiple transistor fingers of the first group of multiple transistor fingers.

18. The transistor of claim 14, wherein:

the first and second segments of the first source manifold have lengths that together are sufficient to intersect ends of all of the multiple transistor fingers.

\* \* \* \* \*